(12) United States Patent
Sung et al.

(10) Patent No.: US 10,038,093 B2
(45) Date of Patent: Jul. 31, 2018

(54) FIN FIELD EFFECT TRANSISTORS HAVING LINERS BETWEEN DEVICE ISOLATION LAYERS AND ACTIVE AREAS OF THE DEVICE

(71) Applicant: Samsung Electronics Co., Ltd., Suwon-si, Gyeonggi-do (KR)

(72) Inventors: Sug-Hyun Sung, Yongin-si (KR); Jung-gun You, Ansan-si (KR); Gi-gwan Park, Suwon-si (KR); Ki-il Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/223,332

(22) Filed: Jul. 29, 2016

(65) Prior Publication Data

US 2017/0062613 A1 Mar. 2, 2017

(30) Foreign Application Priority Data

Sep. 1, 2015 (KR) .......................... 10-2015-0123660

(51) Int. Cl.
*H01L 29/78* (2006.01)
*H01L 21/8238* (2006.01)
*H01L 29/06* (2006.01)
*H01L 27/092* (2006.01)
*H01L 29/66* (2006.01)
*H01L 21/762* (2006.01)

(52) U.S. Cl.
CPC .... *H01L 29/7843* (2013.01); *H01L 21/76224* (2013.01); *H01L 21/823821* (2013.01); *H01L 21/823878* (2013.01); *H01L 27/0924* (2013.01); *H01L 29/0653* (2013.01); *H01L 29/66795* (2013.01); *H01L 29/7851* (2013.01)

(58) Field of Classification Search
CPC ............. H01L 29/7843; H01L 29/0653; H01L 29/66795; H01L 29/7851; H01L 27/0924; H01L 21/76224; H01L 21/823821; H01L 21/823878
See application file for complete search history.

(56) References Cited

U.S. PATENT DOCUMENTS

| 7,148,541 | B2 | 12/2006 | Park et al. |
| 7,728,381 | B2 | 6/2010 | Kahng et al. |
| 8,039,326 | B2 | 10/2011 | Knorr et al. |
| 8,835,257 | B2 | 9/2014 | Kim et al. |
| 8,835,262 | B2 | 9/2014 | Cai et al. |
| 9,576,980 | B1 * | 2/2017 | Basker ................ H01L 27/1211 |
| 2006/0220144 | A1 | 10/2006 | Anezaki et al. |

(Continued)

FOREIGN PATENT DOCUMENTS

KR 10-2007-0000758 A 1/2007

*Primary Examiner* — Christine Enad
(74) *Attorney, Agent, or Firm* — Ward and Smith, P.A.

(57) ABSTRACT

An integrated circuit device includes a fin-type active area protruding from a substrate; a plurality of liners sequentially covering lower side walls of the fin-type active area; a device isolation layer covering the lower side walls of the fin-type active area with the plurality of liners between the device isolation layer and the fin-type active area; and a gate insulating layer extending to cover a channel region of the fin-type active area, the plurality of liners, and the device isolation layer, and including protrusions located on portions of the gate insulating layer which cover the plurality of liners.

19 Claims, 20 Drawing Sheets

(56) References Cited

U.S. PATENT DOCUMENTS

| | | |
|---|---|---|
| 2014/0117462 A1 | 5/2014 | Cheng et al. |
| 2014/0177331 A1 | 6/2014 | Lee |
| 2014/0225219 A1* | 8/2014 | Huang .............. H01L 29/66795 |
| | | 257/510 |
| 2014/0367795 A1* | 12/2014 | Cai .................... H01L 27/0886 |
| | | 257/392 |
| 2015/0102385 A1 | 4/2015 | Fung |
| 2015/0102386 A1 | 4/2015 | Chen et al. |
| 2015/0102411 A1 | 4/2015 | Ching et al. |
| 2015/0115334 A1 | 4/2015 | Liaw |
| 2015/0132920 A1 | 5/2015 | Vellianitis et al. |
| 2015/0137265 A1 | 5/2015 | Hsu et al. |
| 2015/0143315 A1 | 5/2015 | Katoch et al. |
| 2016/0254179 A1* | 9/2016 | Yen ................... H01L 21/76224 |
| | | 257/506 |

* cited by examiner

FIN FIELD EFFECT TRANSISTORS HAVING LINERS BETWEEN DEVICE ISOLATION LAYERS AND ACTIVE AREAS OF THE DEVICE

CROSS-REFERENCE TO RELATED APPLICATION

This application claims the benefit of Korean Patent Application No. 10-2015-0123660, filed on Sep. 1, 2015, in the Korean Intellectual Property Office, the disclosure of which is hereby incorporated herein by reference as if set forth in its entirety.

FIELD

The inventive concept relates to integrated circuit devices, and more particularly, to integrated circuit devices including fin field effect transistors (FETs).

BACKGROUND

As electronic technology has developed, semiconductor devices have been rapidly made smaller. Since it is desired that semiconductor devices have both operating accuracy and high operating speed, methods for optimizing a structure of a transistor included in a semiconductor are being developed.

SUMMARY

Some embodiments of the inventive concept provide an integrated circuit device having a structure capable of improving performance of a highly integrated fin field effect transistor (FET) that is included in a highly integrated semiconductor device.

Further embodiments of the present inventive concept provide an integrated circuit device including: a fin-type active area protruding from a substrate; a plurality of liners sequentially covering lower side walls of the fin-type active area; a device isolation layer covering the lower side walls of the fin-type active area, wherein the plurality of liners are between the device isolation layer and the fin-type active area; and a gate insulating layer extending to cover a channel region of the fin-type active area, the plurality of liners, and the device isolation layer, and including protrusions located on portions of the gate insulating layer which cover the plurality of liners.

In still further embodiments, the plurality of liners each may include an insulating liner and a stress liner that include materials different from each other, the insulating liner may contact the lower side walls of the fin-type active area and may have a first upper surface at a first height from the substrate, and the stress liner may be spaced apart from the lower side walls of the fin-type active area with the insulating liner between the stress liner and the lower side walls of the fin-type active area, and may have a second upper surface at a second height from the substrate, wherein the second height is higher than the first height. The second upper surface of the stress liner may face the protrusions. The substrate may include a trench defining the fin-type active area, the insulating liner may include a side wall extension between the fin-type active area and the stress liner in the trench and a bottom extension connected integrally to the side wall extension and between a bottom surface of the trench and the stress liner, and the side wall extension may have a first thickness and the bottom extension may have a second thickness, wherein the first thickness is greater than the second thickness. The device isolation layer may include an upper surface at a third height from the substrate, wherein the third height is lower than the first height.

In some embodiments, the device isolation layer may include a concave upper surface facing away from the substrate.

In further embodiments, the device isolation layer may include an inclined surface extending from the plurality of liners to a center portion in the upper surface of the device isolation layer, and a vertical distance between the substrate and the inclined surface decreases toward the center portion in the upper surface.

In still further embodiments, the protrusions may surround end portions of the plurality of liners.

In some embodiments, the integrated circuit device may further include a gate line covering the gate insulating layer and the channel region of the fin-type active area, wherein the gate line may include recessed surface portions contacting the protrusions.

Further embodiments of the present inventive concept provide an integrated circuit device including: a pair of fin-type active areas protruding from a substrate and extending in parallel with each other in a first direction; a plurality of liners sequentially covering lower side walls of the pair of the fin-type active areas; a device isolation layer covering the lower side walls of the pair of fin-type active areas with the plurality of liners between the device isolation layer and the lower side walls of the pair of fin-type active areas; a gate insulating layer extending to cover channel regions of the pair of fin-type active areas, the plurality of liners, and the device isolation layer, and including a plurality of protrusions located on portions of the gate insulating layer which cover the plurality of liners; and a gate line formed on the gate insulating layer, the gate line covering the channel regions of the pair of fin-type active areas, the plurality of liners, and the device isolation layer, and extending in a second direction crossing the first direction.

In still further embodiments, the plurality of liners may include an insulating liner and a stress liner that include materials different from each other, the insulating liner may contact the lower side walls of each of the pair of fin-type active areas and may have a first upper surface at a first height from the substrate, and the stress liner may be spaced apart from the lower side walls of each of the pair of fin-type active areas with the insulating liner disposed between the stress liner and the lower side walls of each fin-type active area, and may have a second upper surface at a second height from the substrate, wherein the second height is higher than the first height, and the second upper surface of the stress liner may face one of the plurality of protrusions.

In some embodiments, the substrate may include a shallow trench formed between the pair of fin-type active areas and having a first bottom surface at a first level, and a deep trench formed adjacent the pair of fin-type active areas and having a second bottom surface at a second level that is lower than the first level, the plurality of liners may include an insulating liner contacting lower side walls of a fin-type active area selected from among the pair of fin-type active areas and a stress liner spaced apart from the pair of fin-type active areas, wherein the insulating liner is disposed between the stress liner and the pair of fin-type active areas in the deep trench, the insulating liner may include a side wall extension disposed between the selected fin-type active area and the stress liner and a bottom extension connected integrally to the side wall extension and disposed between the second bottom surface of the deep trench and the stress liner, and the side wall extension may have a first thickness and the bottom extension has a second thickness, wherein the first thickness is greater than the second thickness. The device isolation layer may include a first device isolation layer in the shallow trench and a second device isolation layer in the deep trench, and at least one of the first device isolation layer and the second device isolation layer may have an upper surface at a level that is lower than levels of the first upper surface of the insulating liner and the second upper surface of the stress liner. The device isolation layer may include a first device isolation layer in the shallow trench and a second device isolation layer in the deep trench, and at least one of the first device isolation layer and the second device isolation layer may include a concave upper surface having a level that decreases away from the plurality of liners. The device isolation layer may include a first device isolation layer in the shallow trench and a second device isolation layer in the deep trench, and at least one of the first device isolation layer and the second device isolation layer may include an inclined surface extending from the plurality of liners to a center portion of an upper surface of the device isolation layer.

In further embodiments, the substrate may include a shallow trench formed between the pair of fin-type active areas and having a first bottom surface at a first level, and a deep trench formed adjacent the pair of fin-type active areas and having a second bottom surface at a second level that is lower than the first level, the plurality of liners may include an insulating liner contacting lower side walls of each of the pair of fin-type active areas in the shallow trench and the deep trench and a stress liner spaced apart from the pair of fin-type active areas in the shallow trench and the deep trench, wherein the insulating liner is between the stress liner and each of the pair of fin-type active areas, and a first portion of the insulating liner, which covers the bottom surface of the shallow trench, may be thicker than a second portion of the insulating liner, which covers the bottom surface of the deep trench.

Still further embodiments of the present inventive concept provide an integrated circuit device including: a first fin-type active area protruding from a first region of a substrate and including a first channel region of a first conductivity type; a plurality of liners covering lower side walls of the first fin-type active area on the first region; a first device isolation layer covering the lower side walls of the first fin-type active area, wherein the plurality of liners are disposed between the first device isolation layer and the lower side walls of the first fin-type active area on the first region; a first gate insulating layer on the first region, the first gate insulating layer extending to cover the first channel region of the first fin-type active area, the plurality of liners, and the first device isolation layer, and including first protrusions located on portions of the first gate insulating layer which cover the plurality of liners; a second fin-type active area protruding from a second region of the substrate and including a second channel region of a second conductivity type; a second device isolation layer covering lower side walls of the second fin-type active area on the second region; and a second gate insulating layer on the second region, the second gate insulating layer extending to cover the second channel region and the second device isolation layer.

In some embodiments, the first gate insulating layer may have a first thickness on the first fin-type active area and the second gate insulating layer may have a second thickness on the second fin-type active area, wherein the second thickness is smaller than the first thickness.

In further embodiments, the first gate insulating layer and the second gate insulating layer may include the same material.

In still further embodiments, the plurality of liners may include a first insulating liner and a first stress liner including materials different from each other on the first region, the first insulating liner may contact the lower side walls of the first fin-type active area and may have a first upper surface at a first height from the substrate, and the first stress liner may be spaced apart from the lower side walls of the first fin-type active area and may have a second upper surface at a second height from the substrate, wherein the first insulating layer is between the first stress liner and the lower side walls of the first fin-type active area, and the second height is higher than the first height. The first device isolation layer may have an upper surface at a third height from the substrate, wherein the third height is lower than the first height.

In some embodiments, the substrate may include a first trench defining the first fin-type active area in the first region, the first insulating liner may include a side wall extension disposed between the first fin-type active area and the first stress liner in the first trench, and a bottom extension connected integrally to the side wall extension and disposed between a bottom surface of the first trench and the first stress liner, and the side wall extension of the first insulating liner may have a first thickness and the bottom extension of the first insulating liner has a second thickness, wherein the first thickness is greater than the second thickness.

In further embodiments, the integrated circuit device may further include a second insulating liner covering lower side walls of the second fin-type active area, wherein the second insulating layer is between the second fin-type active area and the second device isolation layer on the second region. The substrate may include a second trench defining the second fin-type active area in the second region, the second insulating liner may include a side wall extension disposed between the second fin-type active area and the second device isolation layer in the second trench, and a bottom extension connected integrally to the side wall extension and disposed between a bottom surface of the second trench and the second device isolation layer, and the side wall extension of the second insulating liner may have a third thickness and the bottom extension of the second insulating liner may have a fourth thickness, wherein the third thickness may be greater than the fourth thickness. The second insulating liner and the second device isolation layer may contact each other.

In still further embodiments, the integrated circuit device may further include a second stress liner disposed between the second insulating liner and the second device isolation layer on the second region, wherein the second insulating liner may have a fourth upper surface at a fourth height from the substrate, the second stress liner may have a fifth upper surface at a fifth height from the substrate, wherein the fifth height may be higher than the fourth height, and a height difference between the fourth upper surface and the fifth upper surface may be smaller than a height difference between the first upper surface and the second upper surface. The second gate insulating layer may include second protrusions located on portions of the second gate insulating layer, which cover the second stress liner.

In some embodiments, the first device isolation layer may include a first inclined surface and a first upper surface having a concave center portion, wherein the first inclined surface may have a level which decreases from an edge at the first fin-type active area toward a center portion of an upper surface, the second device isolation layer may include a second inclined surface and a second upper surface having a concave center portion, wherein the second inclined surface may have a level which decreases from an edge at the second fin-type active area toward a center portion of an upper surface.

In further embodiments, the first channel region of the first fin-type active area may have a first width in a shorter width direction of the first fin-type active area, and the second channel region of the second fin-type active area may have a second width in a shorter width direction of the second fin-type active area, wherein the second width may be smaller than the first width.

Still further embodiments of the present inventive concept provide an integrated circuit device including: a fin-type active area protruding from a substrate; a first liner covering a first lower side wall of the fin-type active area; a first device isolation layer covering the first lower side wall of the fin-type active area, wherein the first liner is disposed between the first device isolation layer and the first lower side wall of the fin-type active area; a second liner covering a second lower side wall of the fin-type active area, wherein the second lower side wall is opposite to the first lower side wall; a second device isolation layer covering the second lower side wall of the fin-type active area, wherein the second liner is disposed between the second device isolation layer and the second lower side wall of the fin-type active area; and a first gate insulating layer extending to cover the fin-type active area, the first liner, and the first device isolation layer, and including first protrusions located on portions of the first gate insulating layer which cover the first liner.

In some embodiments, the fin-type active area may have a cross-sectional profile of opposite side walls in a shorter axis direction, wherein the cross-sectional profile may have an asymmetric shape.

In further embodiments, the integrated circuit device may further include a second gate insulating layer extending to cover the fin-type active area, the second liner, and the second device isolation layer, and connected integrally to the first gate insulating layer. The first gate insulating layer and the second gate insulating layer may be asymmetric about the fin-type active area. The second gate insulating layer may include second protrusions located on portions of the second gate insulating layer, which cover the second liner. Respective thicknesses of the first gate insulating layer and the second gate insulating layer may be different from each other.

In still further embodiments, the substrate may include a first conductivity type transistor region and a second conductivity type transistor region that are adjacent to each other, and the fin-type active area may extend along a boundary between the first conductivity type transistor region and the second conductivity type transistor region.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1A:
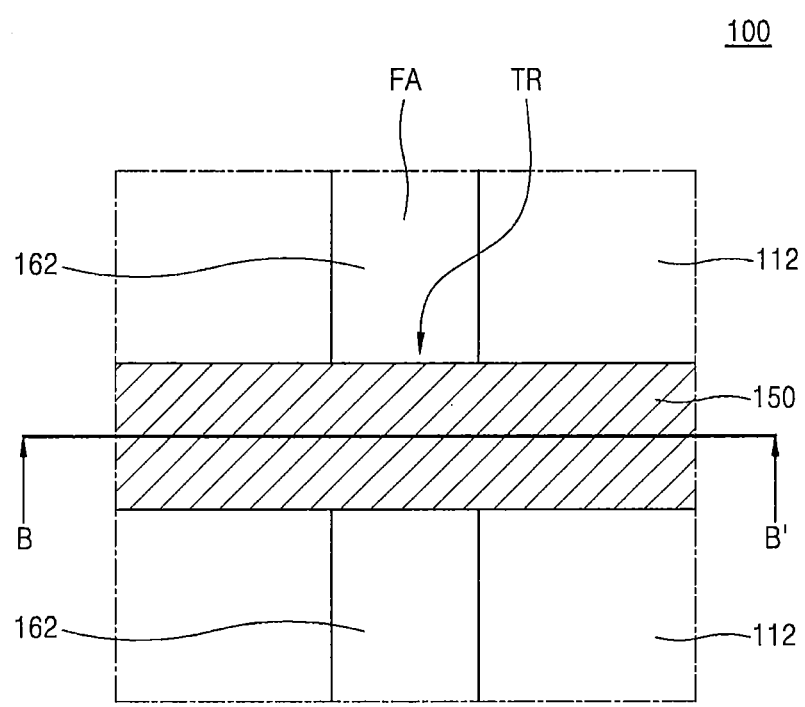
FIG. 1A is a diagram illustrating a plan layout of elements included in an integrated circuit device according to some embodiments of the present inventive concept.

Hereinafter, the inventive concept will be described in detail by explaining example embodiments of the invention with reference to the attached drawings. Like reference numerals in the drawings denote like elements and, thus, detailed descriptions thereof will be omitted in the interest of brevity.

The inventive concept may be embodied in many different forms and should not be construed as limited to the example embodiments set forth herein. Rather, these embodiments are provided so that this disclosure will be thorough and complete, and will fully convey the scope of the inventive concept to those skilled in the art. In the drawings, lengths and sizes of layers and regions may be exaggerated for clarity.

Furthermore, though terms like 'first' and 'second' are used to describe various elements, components, regions, layers, and/or portions in various embodiments of the inventive concept, the elements, components, regions, layers, and/or portions should not be limited by these terms. These terms are only used to distinguish one element, component, region, layer, or portion from another. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment can be embodied in a different manner, a specified process order may be performed in a different manner in order to be described. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. As used herein, the term "and/or" includes any and all combinations of one or more of the associated listed items. Expressions such as "at least one of," when preceding a list of elements, modify the entire list of elements and do not modify the individual elements of the list. A terminology such as "substrate" may denote a substrate itself, or a stack structure including a substrate and predetermined layers or films formed on a surface of the substrate. In addition, a terminology "surface of substrate" may denote an exposed surface of the substrate itself, or an external surface of a predetermined layer or a film formed on the substrate.

Figure 1B:
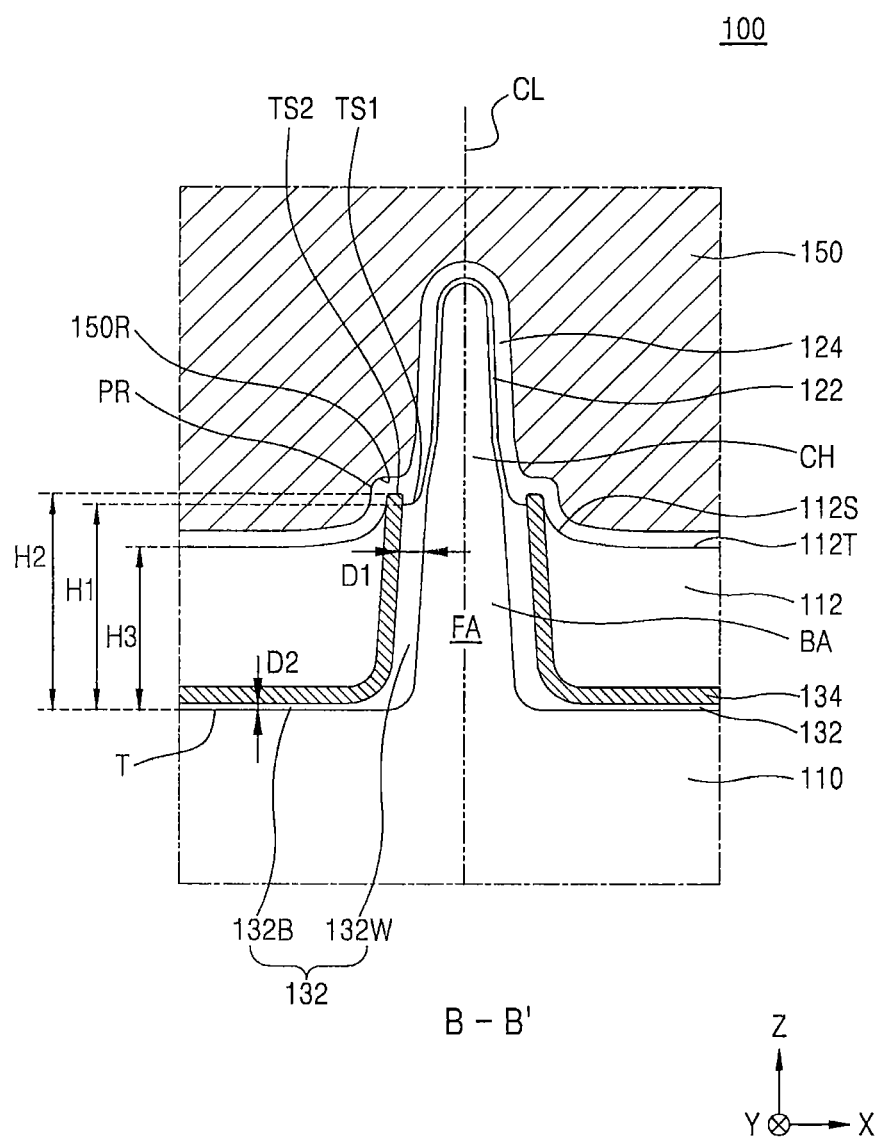
FIG. 1B is a cross section of the integrated circuit device taken along a line B-B' of FIG. 1A.

FIG. 1A is a diagram showing a plan layout of main elements included in an integrated circuit device 100 according to some embodiments of the present inventive concept. FIG. 1B is a cross section of the integrated circuit device 100 taken alone a line B-B' of FIG. 1A.

Referring first to FIGS. 1A and 1B, the integrated circuit device 100 includes a fin-type active area FA protruding from a substrate 110. The substrate 110 may include semiconductor materials, such as Si and Ge, or compound semiconductor materials, such as SiGe, SiC, GaAs, InAs, and InP. In some example embodiments, the substrate 110 may include at least one of a group III-V material and a group IV material. The group III-V material may include a binary, a ternary, or a quarternary compound including at least one group III element and at least one group V element. The group. Ill-V material may be a compound including at least one element of In, Ga, and Al as the group III element and at least one element of As, P, and Sb as the group V element. For example, the group III-V material may be selected from InP, $In_zGa_{1-z}As$ ($0 \le z \le 1$), and $Al_zGa_{1-z}As$ ($0 \le z \le 1$). The binary compound may be one of, for example, InP, GaAs, InAs, InSb and GaSb. The ternary compound may be one of InGaP, InGaAs, AlInAs, InGaSb, GaAsSb and GaAsP. The group IV material may be Si or Ge. However, one or more example embodiments are not limited to the above examples of the group III-V material and the group IV material. The group III-V material and the group IV material such as Ge may be used as channel materials for forming a transistor having a low power consumption and a high operating speed. A high performance complementary metal oxide semiconductor (CMOS) may be fabricated by using a semiconductor substrate including the group III-V material, for example, GaAs, having a higher electron mobility than that of an Si substrate, and a semiconductor substrate having a semiconductor material, for example, Ge, having a higher hole mobility than that of the Si substrate.

In some example embodiments, when an NMOS transistor is formed on the substrate 110, the substrate 110 may include one of the group III-V materials explained above. In some other example embodiments, when a PMOS transistor is formed on the substrate 110, at least a part of the substrate 110 may include Ge. In some embodiments, the substrate 110 may have a silicon-on-insulator (SOI) structure. The substrate 110 may include a conductive region, for example, a well doped with impurities or a structure doped with impurities.

The fin-type active area FA may be defined by a trench T formed in the substrate 110. The fin-type active area FA protrudes from the substrate 110 in a direction perpendicular to a main surface of the substrate 110 (Z direction), and may extend on the substrate 110 along a direction (Y direction in FIGS. 1A and 1B). A device isolation layer 112 covering a lower sidewall of the fin-type active area FA is formed on the substrate 110. The fin-type active area FA protrudes from the device isolation layer 112 as a fin shape.

The fin-type active area FA includes a channel region CH on a lower portion thereof, and a base area BA located under the channel region CH. Lower sidewalls of the fin-type active area FA are embedded by a plurality of liners 132 and 134. Furthermore, the lower side walls of the fin-type active area FA are embedded by the device isolation layer 112 with the plurality of liners 132 and 134 interposed therebetween.

In some example embodiments, the channel region CH of the fin-type active area FA may include a single material. For example, the fin-type active area FA including the channel region CH may include Si. In some other example embodiments, a part of the fin-type active area FA may include Ge, and another part of the fin-type active area FA may include Si.

In FIG. 1B, the fin-type active area FA is formed to have a profile that is symmetric about a center line CL that extends in a direction perpendicular to the main surface of the substrate 110 (Z direction). However, one or more example embodiments are not limited to the example shown in FIG. 1B, and the fin-type active area FA may have an asymmetric profile about the center line CL.

The channel region CH of the fin-type active area FA is covered by an interfacial layer 122. A gate insulating layer 124 and a gate line 150 covering opposite side walls and an upper surface of the fin-type active area FA may extend on the interfacial layer 122 in a direction crossing the direction, in which the fin-type active area FA extends, for example, the X direction in FIGS. 1A and 1B.

The gate insulating layer 124 includes protrusions PR covering upper surfaces of end portions in the plurality of liners 132 and 134. The protrusions PR may be formed at opposite sides of the fin-type active area FA.

The plurality of liners 132 and 134 may include an insulating liner 132 and a stress liner 134 including different materials from each other. In FIG. 1B, the plurality of liners 132 and 134 have a dual-layered structure, but one or more example embodiments are not limited to the example of FIG. 1B. For example, the integrated circuit device 100 may include a liner including three or more layers, instead of the plurality of liners 132 and 134.

The insulating liner 132 contacts a lower side wall of the fin-type active area FA and may include a first upper surface TS1 at a first height H1 from the upper surface of the substrate 110 around the fin-type active area FA, that is, a bottom surface of the trench T. The stress liner 134 is spaced apart from the lower side wall of the fin-type active area FA with the insulating liner 132 interposed therebetween, and may have a second upper surface TS2 at a second height H2 from the upper surface of the substrate 110 around the fin-type active area FA, that is, the bottom surface of the trench T. The second upper surface TS2 of the stress liner 134 may face the protrusion PR of the gate insulating layer 124. The protrusion PR of the gate insulating layer 124 may surround the first upper surface TS1 of the insulating liner 132 and the second upper surface TS2 of the stress liner 134.

The insulating liner 132 includes a side wall extension 132W disposed between the fin-type active area FA and the stress liner 134 in the trench T, and a bottom extension 132B connected integrally to the side wall extension 132W and disposed between the bottom surface of the trench T and the stress liner 134. A first thickness D1 of the side wall extension 132W may be greater than a second thickness D2 of the bottom extension 132B.

A portion of the stress liner 134 extending along the lower side wall of the fin-type active area FA in the trench may be equal to a portion of the stress liner 134 extending along the bottom surface of the trench T in thickness.

In some example embodiments, the insulating liner 132 may include an oxide layer. For example, the insulating liner 132 may include a native oxide layer. In some example embodiments, a first oxide layer included in the insulating liner 132 may be obtained by performing thermal oxidation of a surface of the fin-type active area FA. In some other example embodiments, the insulating liner 132 may include an oxide layer formed through an in-situ steam generation (ISSG) process. In some example embodiments, the insulating liner 132 may have a thickness of about 10 to about 100 Å.

The stress liner 134 may include a material applying stress to the channel region CH of the fin-type active area FA. The stress liner 134 may improve carrier mobility in the channel region CH by applying stress to the channel region CH of the fin-type active area FA. In some example embodiments, when the channel region CH is an N-type channel region, the stress liner 134 may include a material applying tensile stress to the channel region CH. For example, the stress liner 134 may include silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), silicon dioxide ($SiO_2$), polysilicon, or a combination thereof. In some example embodiments, when the channel region CH is a P-type channel region, the stress liner 134 may include a material applying compressive stress to the channel region CH. For example, the stress liner 134 may include SiN, SiON, SiBN, SiC, SiC:H, SiCN, SiCN:H, SiOCN, SiOCN:H, SiOC, $SiO_2$, polysilicon, or a combination thereof. In some example embodiments, the stress liner 134 may have a thickness of about 10 to about 100 Å.

The gate line 150 may have recess surface portions 150R at locations corresponding to the protrusions PR of the gate insulating layer 124, adjacent to the first upper surface TS1 of the insulating liner 132 and the second upper surface TS2 of the stress liner 134.

The device isolation layer 112 may have an upper surface at a third height H3 that is lower than the first height H1 from the upper surface of the substrate 110 around the fin-type active area FA, that is, the bottom surface of the trench T. The device isolation layer 112 has an upper surface 112T that is concave toward the opposite side of the substrate 110. The device isolation layer 112 may include an inclined surface 112S that extends from the stress liner 134 toward a center portion of the upper surface 112T of the device isolation layer 112. A vertical distance from the inclined surface 112S to the substrate 110 may be reduced toward the center portion of the upper surface 112T.

A transistor TR may be formed on a portion where the fin-type active area FA and the gate line 150 cross each other. The transistor TR is a metal oxide semiconductor (MOS) transistor having a three-dimensional structure, a channel of which is formed on the upper surface and opposite side walls of the fin-type active area FA. The MOS transistor TR may configure an NMOS transistor or a PMOS transistor.

In some example embodiments, the device isolation layer 112 may include a silicon-containing insulating layer, such as a silicon oxide layer, a silicon nitride layer, a silicon oxynitride layer, and a silicon carbonitride film, polysilicon, or a combination thereof. For example, the device isolation layer 112 may include a film formed by a deposition process or a coating process. In some example embodiments, the device isolation layer 112 may include an oxide layer formed by a flowable chemical vapour deposition (FCVD) process or a spin coating process. For example, the device isolation layer 112 may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but is not limited thereto.

In some example embodiments, the interfacial layer 122 may be obtained by oxidizing the surface of the fin-type active area FA. The interfacial layer 122 may contact the fin-type active area FA. The interfacial layer 122 may repair interfacial defects between the fin-type active area FA and the gate insulating layer 124.

In some example embodiments, the interfacial layer 122 may include a low dielectric material layer having a dielectric constant of 9 or less, for example, a silicon oxide layer, a silicon oxynitride layer, or a combination thereof. In some other example embodiments, the interfacial layer 122 may include silicate, a combination of the silicate and a silicon oxide layer, or a combination of the silicate and a silicon oxynitride layer. In some example embodiments, the interfacial layer 122 may have a thickness of about 5 Å to about 20 Å, but is not limited thereto. In some example embodiments, the interfacial layer 122 may be omitted.

The gate insulating layer 124 may include a material having a dielectric constant greater than that of the interfacial layer 122. For example, the gate insulating layer 124 may have a dielectric constant of about 10 to about 25. The gate insulating layer 124 may include a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but is not limited thereto. The gate insulating layer 124 may be formed by an atomic layer deposition (ALD), a chemical vapour deposition (CVD), or physical vapor deposition (PVD) process. The gate insulating layer 124 may have a thickness of about 10 Å to about 40 Å, but is not limited thereto.

The gate line 150 may include a layer containing metal for adjusting a work function, and a layer containing metal for filling a gap formed on an upper portion of the layer containing metal for adjusting the work function. In some example embodiments, the gate line 150 may have a structure in which a metal nitride layer, a metal layer, a conductive capping layer, and a gap-fill metal layer are sequentially stacked. The metal nitride layer and the metal layer may each include at least one metal material selected from Ti, W, Ru, Nb, Mo, Hf, Ni, Co, Pt, Yb, Tb, Dy, Er, and Pd. The metal nitride layer and the metal layer may be formed by the ALD process, a metal organic ALD (MOALD) process, or a metal organic CVD (MOCVD) process. The conductive capping layer may act as a protective layer for preventing oxidation of a surface of the metal layer. In addition, the conductive capping layer may act as a wetting layer for making a deposition of another conductive layer on the metal layer easy. The conductive capping layer may include a metal nitride layer, for example, TiN, TaN, or a combination thereof, but is not limited thereto. The gap-fill metal layer may extend on the conductive capping layer. The gap-fill metal layer may include a W layer. The gap-fill layer may be formed by the ALD, the CVD, or the PVD process. The gap-fill metal layer may embed a recess space formed by a step between regions on an upper surface of the conductive capping layer without a void. In some example embodiments, the gate line 150 may include a stack structure of TiAlC/TiN/W, a stack structure of TiN/TaN/TiAlC/TiN/W, or a stack structure of TiN/TaN/TiN/TiAlC/TiN/W. In the above stack structures, a TiAlC layer or a TiN layer may function as a layer containing metal for adjusting the work function.

As illustrated in FIG. 1A, a pair of source and drain regions 162 may be formed on opposite sides of the gate line 150 in the fin-type active area FA. The pair of source and drain regions 162 may include a semiconductor layer that is epitaxially grown from the fin-type active area FA. The source and drain regions 162 may have an embedded SiGe structure including a Si layer that is epitaxially grown, an SiC layer that is epitaxially grown, and a plurality of SiGe layers that are epitaxially grown.

In the integrated circuit device 100 illustrated with reference to FIGS. 1A and 1B, the gate insulating layer 124 covering the channel region CH of the fin-type active area FA includes the protrusions PR on the portions covering the upper surfaces of the end portions of the plurality of liners 132 and 134 that cover the lower side walls of the fin-type active area FA. According to the integrated circuit device 100 having the above structure according to some embodiments, optimized operating characteristics may be obtained according to a desired design in a highly integrated semiconductor device, and performances of a fin FET that is highly downscaled may be improved.

Figure 2:
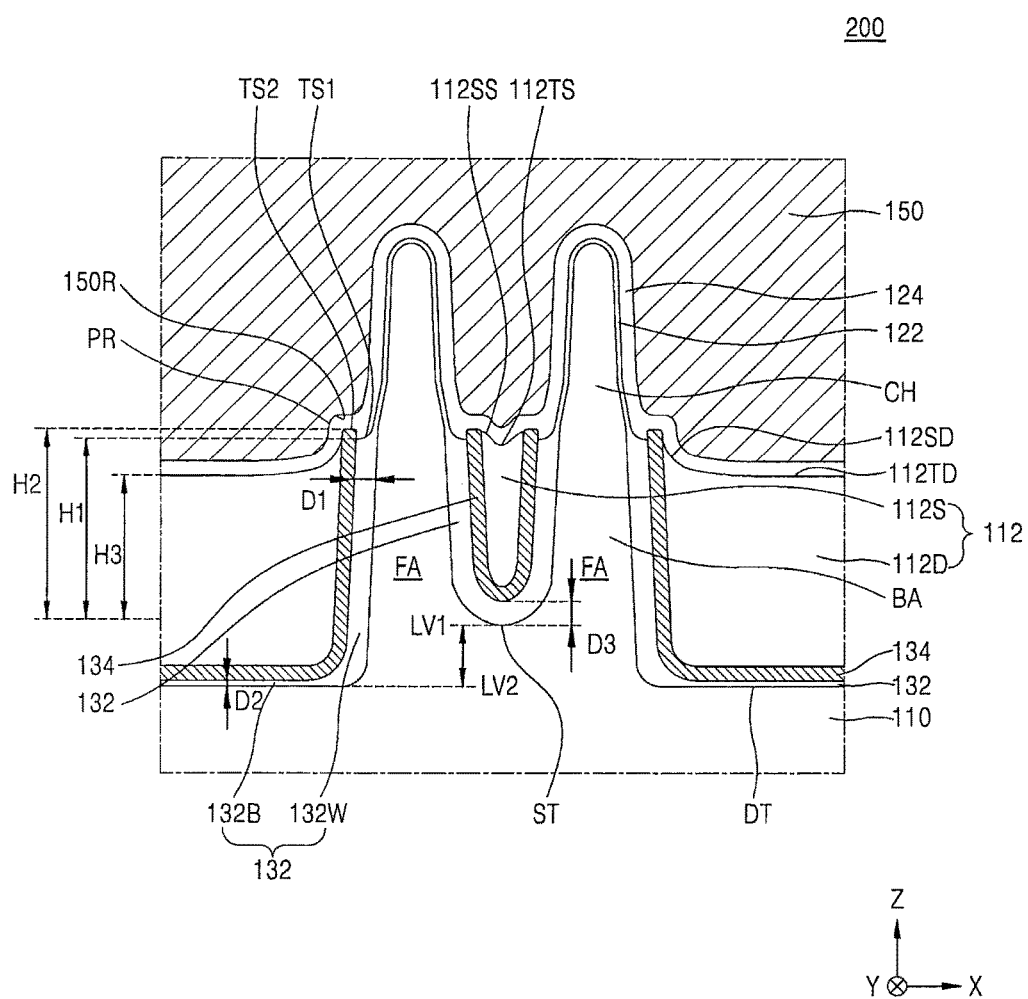
FIG. 2 is a cross-section of an integrated circuit device according to some embodiments of the present inventive concept.

Referring now to FIG. 2, a cross section of an integrated circuit device 200 according to some embodiments of the present inventive concept will be discussed. In FIG. 2, like reference numerals as those of FIGS. 1A and 1B denote the same elements and, thus, detailed descriptions of these elements will be omitted in the interest of brevity.

As illustrated in FIG. 2, the integrated circuit device 200 includes a pair of fin-type active areas FAs protruding from the substrate 110 in a direction perpendicular to the main surface of the substrate 110 (Z direction) and extending in parallel with each other.

A lower side wall of each of the fin-type active areas FAs is covered by the plurality of liners 132 and 134. The device isolation layer 112 covers the lower side wall of the each fin-type active area FA with the plurality of liners 132 and 134 interposed therebetween. The plurality of liners 132 and 134 may include the insulating liner 132 and the stress liner 134 including different materials from each other.

A surface of the channel region CH in each of the fin-type active area FAs is covered by the interfacial layer 122. The gate insulating layer 124 and the gate line 150 covering opposite side walls and upper surfaces of the pair of fin-type active areas FA on the interfacial layer 122 may extend in a direction (X direction of FIG. 2) crossing an extending direction (Y direction) of the pair of fin-type active areas FA.

The gate insulating layer 124 and the gate line 150 extend to cover the opposite side walls and the upper surface of the channel region CH in each of the pair of fin-type active areas FA, the plurality of liners 132 and 134, and the device isolation layer 112.

The gate insulating layer 124 may include a plurality of protrusions PR from the portions covering the plurality of liners 132 and 134. The gate line 150 may have a plurality of recess surfaces 150R having shapes corresponding to those of the plurality of protrusions PR on portions facing the protrusions PR of the gate insulating layer 124.

The plurality of protrusions PR of the gate insulating layer 124 may be formed on portions facing the second upper surface TS2 of the stress liner 134.

The substrate 110 includes a shallow trench ST formed between the pair of fin-type active area FA and having a bottom surface of a first level LV1, and a deep trench DT formed at a side of each of the fin-type active areas FA and having a bottom surface of a second level LV2 that is lower than the first level LV1.

In each of the shallow trench ST and the deep trench DT, the insulating liner 132 and the stress liner 134 may be formed. In addition, an upper space of the stress liner 134 in the shallow trench ST and the deep trench DT may be filled by the device isolation layer 112.

The insulating liner 132 may be formed in the deep trench DT so as to contact a lower side wall of each of the fin-type active areas FA. The stress liner 134 is spaced apart from the fin-type active area FA with the insulating liner 132 disposed therebetween.

In the deep trench DT, the insulating layer 132 includes a side wall extension 132W disposed between the fin-type active area FA and the stress liner 134, and a bottom extension 132B connected integrally to the side wall extension 132W and disposed between the bottom surface of the deep trench DT and the stress liner 134. In the deep trench DT, a first thickness D1 of the side wall extension 132W is greater than a second thickness D2 of the bottom extension 132B. The stress liner 134 in the deep trench DT may have a constant thickness.

In the shallow trench ST, the insulating liner 132 may be formed to have a constant thickness along an inner wall of the shallow trench ST. Accordingly, a portion of the insulating liner 132 covering a side wall of the shallow trench ST may have the same thickness as that of a portion of the insulating liner 132 covering a bottom surface of the shallow trench ST. In the shallow trench ST, the stress liner 134 may have a constant thickness.

In some example embodiments, a third thickness D3 of the portion of the insulating liner 132 covering the bottom surface of the shallow trench ST may be greater than the second thickness D2 of the bottom extension 132B covering the bottom surface of the deep trench DT.

The device isolation layer 112 may include a first device isolation layer 112S filling the shallow trench ST, and a second device isolation layer 112D filling the deep trench DT. The first and second device isolation layers 112S and 112D may respectively have upper surfaces 112TS and 112TD at lower levels than the upper surfaces of the insulating liner 132 and the stress liner 134. According to the example embodiment, the upper surfaces 112TS and 112TD of the first and second device isolation layers 112S and 112D may be located at lower level than the first upper surface TS1 of the insulating liner 132. In another example embodiment, the upper surfaces 112TS and 112TD of the first and second device isolation layers 112S and 112D may be lower than the second upper surface TS2 of the stress liner 134. The upper surfaces 112TS and 112TD of the first and second device isolation layers 112S and 112D may be lowered away from the insulating liner 132 and the stress liner 134 to have concave center portions.

The upper surfaces 112TS and 112TD of the first and second device isolation layers 112S and 112D may respectively have inclined surfaces 112SS and 112SD extending from the insulating liner 132 and the stress liner 134 toward the center portions of the first and second device isolation layers 112S and 112D. In some example embodiments, an inclination of the inclined surface 112SS in the upper surface 112TS of the first device isolation layer 112S may be greater than that of the inclined surface 112SD in the upper surface 112TD of the second device isolation layer 112D, but is not limited thereto.

Detailed structures of the first and second device isolation layers 112S and 112D are substantially similar to those of the device isolation layer 112 illustrated with reference to FIGS. 1A and 1B.

In the integrated circuit device 200 illustrated with reference to FIG. 2, the gate insulating layer 124 covering the channel regions CH of the pair of fin-type active areas FA includes the protrusions PR from portions covering upper surfaces on the end portions of the plurality of liners 132 and 134 covering the lower side walls of the pair of fin-type active areas FA. The integrated circuit device 200 having the above structure according to some embodiments may obtain optimized operating characteristics according to an intended design in a highly integrated semiconductor device, and accordingly, performances of a fin FET that is highly downscaled may be improved.

Figure 3A:
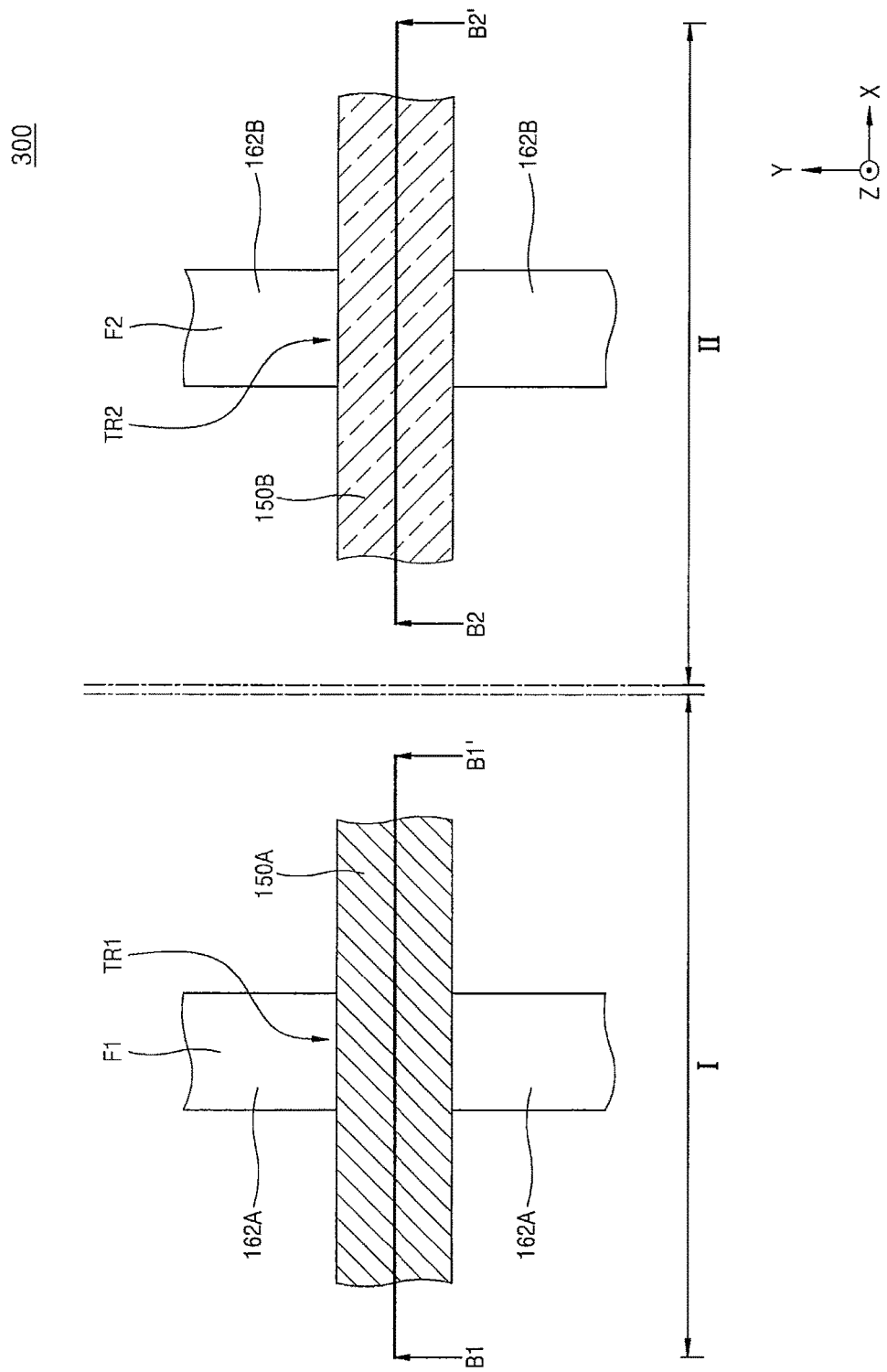
FIG. 3A is a diagram illustrating a plan layout of elements included in an integrated circuit device according to some embodiments of the present inventive concept.
Figure 3B:
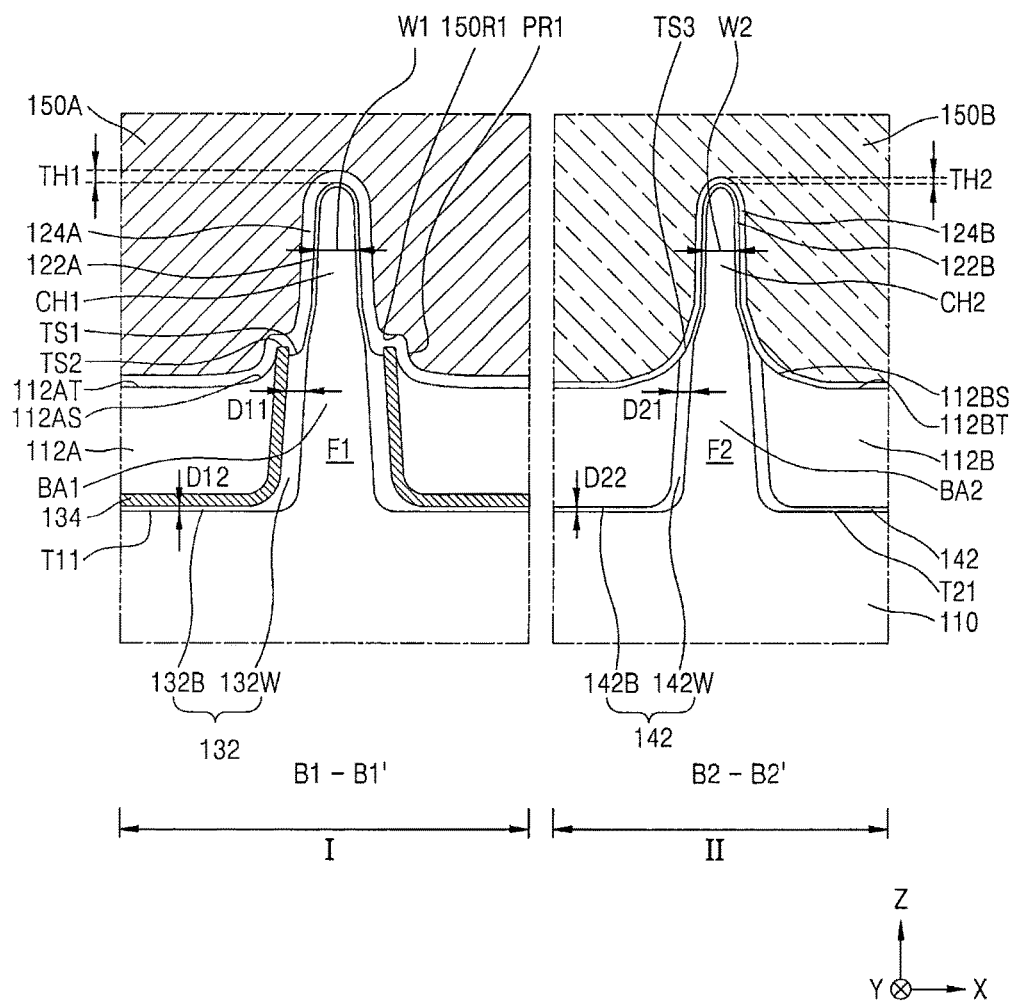
FIG. 3B is a cross section of the integrated circuit device taken along a line B1-B1' and a line B2-B2' of FIG. 3A.

Referring now to FIG. 3A, a plan layout diagram illustrating main elements of an integrated circuit device 300 according to some embodiments and FIG. 3B a cross section of the integrated circuit device 300 taken along a line B1-B1' and B2-B2' of FIG. 3A will be discussed. In FIGS. 3A and 3B, like reference numerals as those of FIGS. 1A and 1B denote the same elements and, thus, detailed descriptions thereof will be omitted in the interest of brevity.

Referring to FIGS. 3A and 3B, the substrate 110 of the integrated circuit device 300 includes a first region I and a second region II. The first and second regions I and II of the substrate 110 denote different regions in the substrate 110, that is, regions requiring different threshold voltages from each other. For example, the first region I may be an NMOS transistor and the second region II may be a PMOS transistor, but are not limited thereto.

In the first region I of the integrated circuit device 300, a first gate line 150A extends on a first fin-type active area F1 to cross the first fin-type active area F1, and in the second region II, a second gate line 150B extends on a second fin-type active area F2 to cross the second fin-type active area F2.

A first transistor TR1 may be formed on a portion where the first fin-type active area F1 and the first gate line 150A cross each other. A second transistor TR2 may be formed on a portion where the second fin-type active area F2 and the second gate line 150B cross each other. The first transistor TR1 and the second transistor TR2 may be MOS transistors having three-dimensional structures, in which channels are formed on an upper surface and opposite side surfaces of each of the first and second fin-type active areas F1 and F2. The MOS transistor may be an NMOS transistor or a PMOS transistor. For example, the first transistor TR1 formed on the first region I may be an NMOS transistor and the second transistor TR2 formed on the second region II may be a PMOS transistor, but are not limited thereto.

The technical idea of the present inventive concept is not limited to the structure shown in FIG. 3A. For example, in each of the first region I and the second region II, at least one gate line may extend to cross a single or a plurality of fin-type active areas, and the number of the gate lines and the fin-type active areas crossing each other may not be limited to the above example.

As shown in FIG. 3B, in the first region I, the first fin-type active area F1 may be defined by a first trench T11 formed in the substrate 110. The first fin-type active area F1 may protrude from the substrate 110 in a direction perpendicular to a main surface of the substrate 110, that is, Z-axis direction. The first fin-type active area F1 may include a first channel region CH1. Opposite side walls of the first fin-type active area F1 are covered by the first device isolation layer 112A on a lower portion of the first channel region CH1.

The first fin-type active area F1 may have a line shape linearly extending on the substrate 110 along a lengthwise direction (Y-axis direction). The first channel region CH1 of the first fin-type active area F1 has a width smaller than that of a first base area BA1 located thereunder, wherein the first channel region CH1 protrudes above the first device isolation layer 112A. The first channel region CH1 of the first fin-type active area F1 may have a first width W1 in a shorter axis direction of the first fin-type active area F1, that is, X-axis direction.

The first channel region CH1 of the first fin-type active area F1 is covered by a first interfacial layer 122A. A first gate insulating layer 124A and the first gate line 150A covering the opposite side walls and the upper surface of the first fin-type active area F1 may extend on the first interfacial layer 122A in a direction crossing the extending direction of the first fin-type active area F1 (X-axis direction in FIGS. 3A and 3B).

The first gate insulating layer 124A includes first protrusions PR1 covering upper surfaces at end portions of the plurality of liners 132 and 134. The first protrusions PR1 may be disposed at opposite sides of the first fin-type active area F1.

The first gate line 150A may include recess surface portions 150R1 having shapes corresponding to those of the first protrusions PR1 at the portions of the first protrusions PR1 of the first gate insulating layer 124A, to be adjacent to the first upper surface TS1 of the insulating liner 132 and the second upper surface TS2 of the stress liner 134.

The plurality of liners 132 and 134 disposed between the first fin-type active area F1 and the first device isolation layer 112A may extend along side walls and a bottom surface of a first trench T11. The plurality of liners 132 and 134 may include the insulating liner 132 and the stress liner 134 as described above with reference to FIGS. 1A and 1B. The insulating liner 132 contacts a lower side wall of the first fin-type active area F1, and may have the first upper surface TS1 at a level that is higher than a height from the bottom surface of the first trench T11 to an upper surface 112AT of the first device isolation layer 112A. The stress liner 134 is spaced apart from the lower side wall of the first fin-type active area F1 with the insulating liner 132 disposed therebetween, and may have the second surface TS2 located at a level that is higher than the first upper surface TS1 of the insulating liner 132 from the bottom surface of the first trench T11. The second upper surface TS2 of the stress liner 134 may face the first protrusions PR1 of the first gate insulating layer 124A. The first protrusions PR1 of the first gate insulating layer 124A may surround the first upper surface TS1 of the insulating liner 132 and the second upper surface TS2 of the stress liner 134.

The upper surface 112AT of the first device isolation layer 112A includes a first inclined surface 112AS that is lowered from an edge at the side of the first fin-type active area F1 toward an upper surface of the center portion, and may have a concave shape at the center portion of the upper surface 112AT.

The insulating liner 132 includes a side wall extension 132W disposed between the first fin-type active area F1 and the stress liner 134 in the first trench T11, and a bottom extension 132B connected integrally to the side wall extension 132W and disposed between the bottom surface of the first trench T11 and the stress liner 134. A first thickness D11 of the side wall extension 132W may be greater than a second thickness D12 of the bottom extension 132B.

In the stress liner 134, a portion extending along the lower side wall of the first fin-type active area F1 in the first trench T11 has a thickness that is substantially the same as that of a portion extending along the bottom surface of the first trench T11.

In the first region I, the first gate insulating layer 124A and the first gate line 150A may extend the first channel region CH1 of the first fin-type active area F1, the first upper surface TS1 of the insulating liner 132, the second upper surface TS2 of the stress liner 134, and the concave upper surface 112AT of the first device isolation layer 112A.

In the second region II, the second fin-type active area F2 may be defined by a second trench T21 formed in the substrate 110. The second fin-type active area F2 may protrude from the substrate 110 in a direction perpendicular to the main surface of the substrate 110 (Z-axis direction). The second fin-type active area F2 may include a second channel region CH2. Opposite side walls of the second fin-type active area F2 are covered by a second device isolation layer 112B at a lower portion of the second channel region CH2.

The second fin-type active area F2 may have a line shape linearly extending on the substrate 110 along a lengthwise direction (Y-axis direction). The second channel region CH2 of the second fin-type active area F2, which protrudes above the second device isolation layer 112B, may have a width that is less than that of a second base area BA2 located thereunder. The second channel region CH2 of the second fin-type active area F2 may have a second width W2 in the shorter axis direction (X-axis direction) of the second fin-type active area F2, wherein the second width W2 is smaller than the first width W1 of the first channel region CH1 of the first fin-type active area F1.

The second channel region CH2 of the second fin-type active area F2 is covered by a second interfacial layer 122B. A second gate insulating layer 124B and the second gate line 150B covering the opposite side walls and an upper surface of the second fin-type active area F2 may extend on the second interfacial layer 122B in a direction crossing the extending direction of the second fin-type active area F2 (X-axis direction in FIGS. 3A and 3B).

An insulating liner 142 covering a lower side wall of the second fin-type active area F2 may be disposed between the second fin-type active area F2 and the second device isolation layer 112B. The insulating liner 142 may extend along side walls and a bottom surface of the second trench T21. The insulating liner 142 may include a side wall extension 142W disposed between the second fin-type active area F2 and the second device isolation layer 112B in the second trench T21, and a bottom extension 142B connected integrally to the side wall extension 142W and disposed between the bottom surface of the second trench T21 and the second device isolation layer 112B. A first thickness D21 of the side wall extension 142W may be greater than a second thickness D22 of the bottom extension 142B. The insulating liner 142 may contact the second device isolation layer 112B.

The insulating liner 142 may include an oxide layer. For example, the insulating liner 142 may include a native oxide layer. In some example embodiments, the insulating liner 142 may be obtained by performing a thermal oxidation on a surface of the second fin-type active area F2. In some other example embodiments, the insulating liner 142 may be an oxide layer formed by an ISSG process. In some example embodiments, the insulating liner 142 may have a thickness of about 10 Å to about 100 Å. In some example embodiments, the insulating liner 142 may include the same material as that of the insulating liner 132 formed on the first region I.

In the second region II, the insulating liner 142 may have a third upper surface TS3 facing the second gate insulating layer 124B. The second gate insulating layer 124B may not include a protrusion on a portion facing the third upper surface TS3. The second device isolation layer 112B may have an upper surface 112BT of an edge portion at the side of the second fin-type active area F2, wherein the upper surface 112BT may extend continuously from the third upper surface TS3 of the insulating liner 142 without forming a step. The second device isolation layer 112B includes a second inclined surface 112BS that is gradually lowered from the edge portion at the side of the second fin-type active area F2 toward an upper surface of the center portion thereof, and the upper surface 112BT of the second device isolation layer 112B may have a concave surface at the center portion.

In the second region II, the second gate insulating layer 124B and the second gate line 150B may extend to cover the second channel region CH2 of the second fin-type active area F2, the third upper surface TS3 of the insulating liner 142, and the concave upper surface 112BT of the second device isolation layer 112B.

The first gate insulating layer 124A formed on the first region I and the second gate insulating layer 124B formed on the second region II may have different thicknesses from each other. In FIG. 3B, a first thickness TH1 of the first gate insulating layer 124A formed on the first region I is greater than a second thickness TH2 of the second gate insulating layer 124B formed on the second region II. For example, when the first region I is an NMOS transistor region and the second region II is a PMOS transistor region, the first thickness TH1 of the first gate insulating layer 124A may be greater than the second thickness TH2 of the second gate insulating layer 124B so that a work function of each of the first and second transistors TR1 and TR2 formed on the first and second regions I and II may be optimized. However, one or more example embodiments are not limited to the example illustrated with reference to FIG. 3B, but various modifications may be performed within the scope of the inventive concept.

Detailed structures of the first and second device isolation layers 112A and 112B, the first and second interfacial layers 122A and 122B, the first and second gate insulating layers 124A and 124B, and the first and second gate lines 150A and 150B illustrated in FIGS. 3A and 3B are similar to those of the device isolation layer 112, the interfacial layer 122, the gate insulating layer 124, and the gate line 150 described above with reference to FIGS. 1A and 1B.

In some example embodiments, in the first and second regions I and II, the first and second gate insulating layers 124A and 124B may each include a single layer. In some example embodiments, the first and second gate insulating layers 124A and 124B may have the same material. In some example embodiments, the first gate line 150A may include a stack structure of TiAlC/TiN/W or TiN/TaN/TiAlC/TiN/W, and the second gate line 150B may include a stack structure of TiN/TaN/TiN/TiAlC/TiN/W. In the first gate line 150A, a TiAlC layer may act as a metal containing layer for adjusting work function, and in the second gate line 150B, a TiN may act as a metal containing layer for adjusting work function.

As illustrated in FIG. 3A, in the first region I, first source/drain regions 162A may be formed on opposite sides of the first gate line 150A in the first fin-type active area F1. Furthermore, in the second region II, second source/drain regions 162B may be formed at opposite sides of the second gate line 150B on the second fin-type active area F2.

Although not shown in the drawings, the first and second source/drain regions 162A and 162B may each include a semiconductor layer that is epitaxially grown from the first or second fin-type active area F1 or F2. The first and second source/drain regions 162A and 162B may each include an embedded SiGe structure including a plurality of SiGe layers that are epitaxially grown, an Si layer that is epitaxially grown, or an SiC layer that is epitaxially grown. The first source/drain region 162A may have different structure from the second source/drain region 162B.

In the integrated circuit device 300 illustrated above with reference to FIGS. 3A and 3B, in the first and second regions I and II having the channel regions of different conductivity types, the liners covering the lower side walls of the first and second fin-type active areas F1 and F2 have different structures from each other, and the shapes of the first and second gate insulating layers 124A and 124B covering the first and second channel regions CH1 and CH2 of the first and second fin-type active areas F1 and F2 and the upper surfaces of the end portions of the liners are different from each other. According to the integrated circuit device having the above structure according to the one or more example embodiments, when the fin FETs that are highly downscaled having the channel regions of different conductivity types are formed on the plurality of regions of the substrate, optimal operating characteristics suitable for each of the transistors respectively formed on the plurality of regions may be obtained, and performances of the transistors may be improved. In addition, multi-gate transistors performing different functions thereof may be easily formed on the first region I and the second region II.

Figure 4:
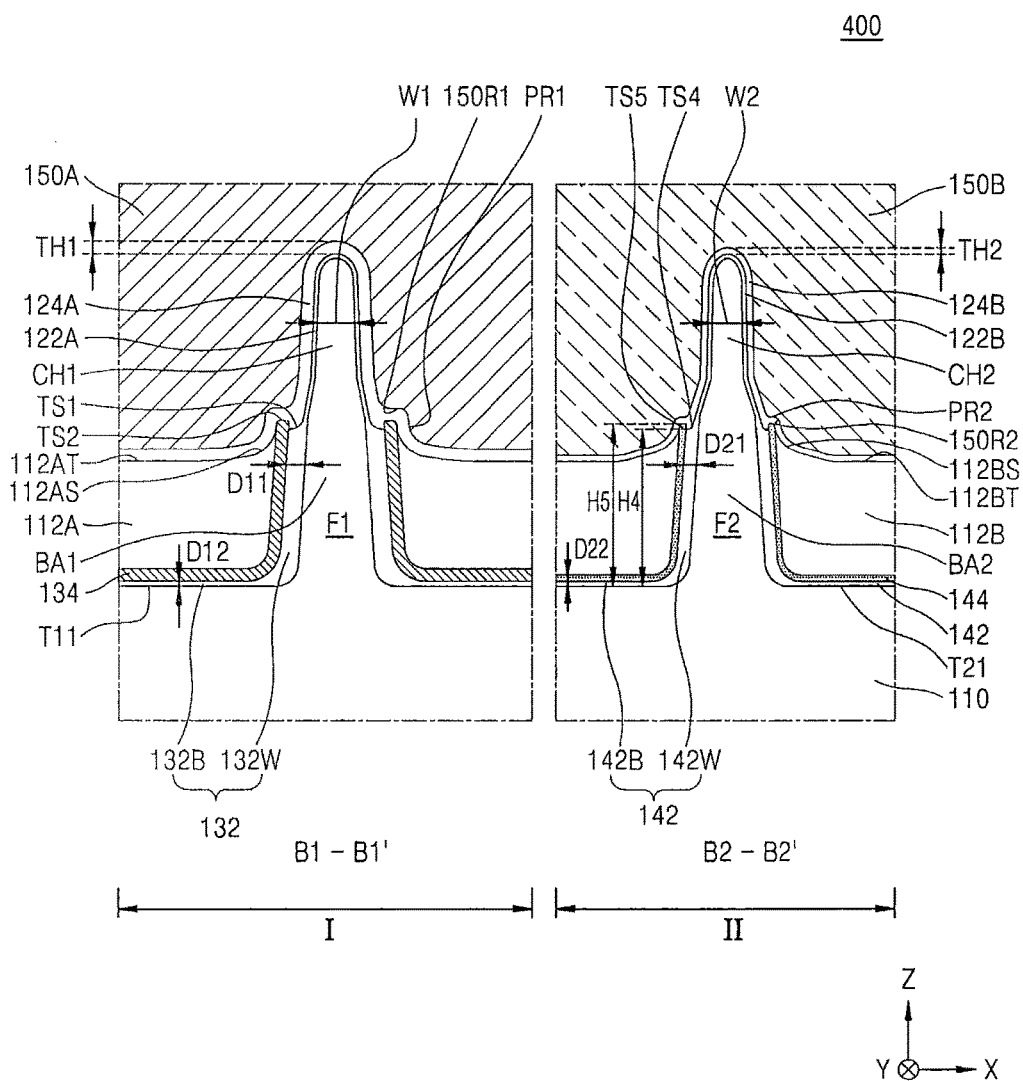
FIG. 4 is a cross section of an integrated circuit device according to some embodiments of the present inventive concept.

Referring now to FIG. 4, a cross section of an integrated circuit device 400 according to some embodiments, taken along a line B1-B1' and a line B2-B2' of FIG. 3A will be discussed. In FIG. 4, like reference numerals as those of FIGS. 3A and 3B denote the same elements and, thus, detailed descriptions thereof are omitted in the interest of brevity.

Referring to FIG. 4, the integrated circuit device 400 has substantially the same structure as that of the integrated circuit device 300 illustrated in FIGS. 3A and 3B, except that the integrated circuit device 400 of FIG. 4 further include a stress liner 144 disposed between the insulating liner 142 and the second device isolation layer 112B on the second region II.

In the second region II, the insulating liner 142 has a fourth upper surface TS4 having a fourth height H4 from the substrate 110, that is, the bottom surface of the second trench T21, and the stress liner 144 may have a fifth upper surface TS5 having a fifth height H5 that is higher than the fourth height H4 from the substrate 110, that is, the bottom surface of the second trench T21. The fifth height H5 of the fifth upper surface TS5 of the stress liner 144 formed on the second region II may be lower than the height of the second upper surface TS2 of the stress liner 134 formed on the first region I. In some example embodiments, a difference between the heights of the fourth upper surface TS4 of the insulating liner 142 and the fifth upper surface TS5 of the stress liner 144 in the second region II may be less than a difference between the heights of the first upper surface TS1 of the insulating liner 132 and the second upper surface TS2 of the stress liner 134 on the first region I.

In the second region II, the second gate insulating layer 124B may include second protrusions PR2 on portions covering the stress liner 144. The second gate line 150B may include recess surface portions 150R2 having shapes corresponding to those of the second protrusions PR2 of the second gate insulating layer 124B, at locations adjacent to the upper surface TS4 of the insulating liner 142 and the fifth upper surface TS5 of the stress liner 144.

The second protrusions PR2 formed on the second region II may be smaller than the first protrusions PR1 formed on the first region I.

Detailed structures of the stress liner 144 are similar to those of the stress liner 134 described above with reference to FIGS. 1A and 1B. In some example embodiments, a thickness of the stress liner 144 formed on the second region II may be less than that of the stress liner 134 formed on the first region I. For example, the stress liner 134 formed on the first region I may have a thickness of about 50 Å to about 100 Å, and the stress liner 144 formed on the second region II may have a thickness of about 10 Å to about 40 Å, but they are not limited thereto.

For example, the stress liner 134 formed on the first region I applies a first stress to the first channel region CH1 to improve carrier mobility in the first channel region CH1. In some example embodiments, when the first channel region CH1 is an N-type channel region, the stress liner 134 may include a material applying a tensile stress to the first channel region CH1. For example, the first stress liner 134 may include SiN, SiON, SiBN, SiC, SiC:H, SiCN, SiCN:H, SiOCN, SiOCN:H, SiOC, $SiO_2$, polysilicon, or a combination thereof. The stress liner 144 formed on the second region II may include a material applying a second stress to the second channel region CH2, wherein the second stress is different from the first stress. The stress liner 144 may apply the second stress to the second channel region CH2 to improve carrier mobility in the second channel region CH2. In some example embodiments, when the second channel region CH2 is a P-type channel region, the stress liner 144 may include a material applying a compressive stress to the second channel region CH2. For example, the stress liner 144 may include SiN, SiON, SiBN, SiC, SiC:H, SiCN, SiCN:H, SiOCN, SiOCN:H, SiOC, $SiO_2$, polysilicon, or a combination thereof.

In some example embodiments, the stress liner 134 formed on the first region I and the stress liner 144 formed on the second region II may include the same material. In some other example embodiments, the stress liner 134 formed on the first region I and the stress liner 144 formed on the second region II may include different materials from each other. In some example embodiments, the stress liner 134 formed on the first region I and the stress liner 144 formed on the second region II may include the same material, which applies different stresses to adjacent channel regions. The stress liner 134 formed on the first region I and the stress liner 144 formed on the second region II may respectively include films that are obtained through different processes. Detailed descriptions about the stress liner 144 may adopt the descriptions about the stress liner 134 that is described above with reference to FIGS. 1A and 1B.

Figure 5A:
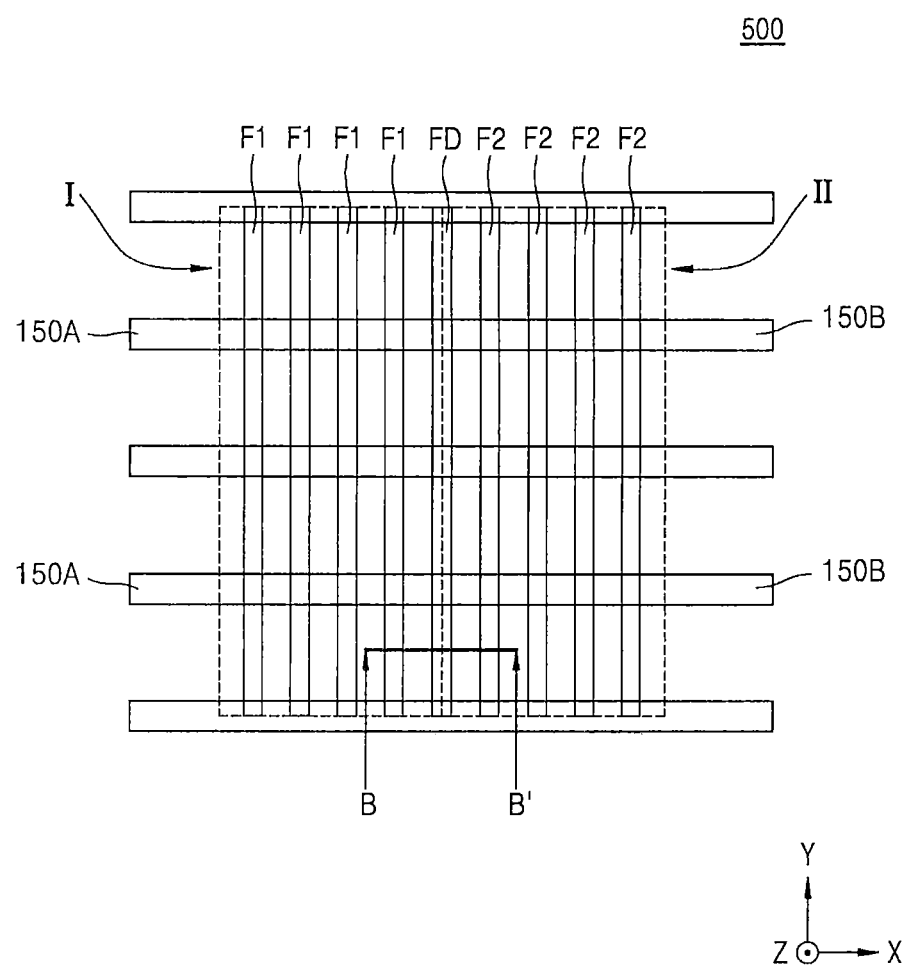
FIG. 5A is a diagram illustrating a plan layout of elements included in an integrated circuit device according to some embodiments of the present inventive concept.
Figure 5B:
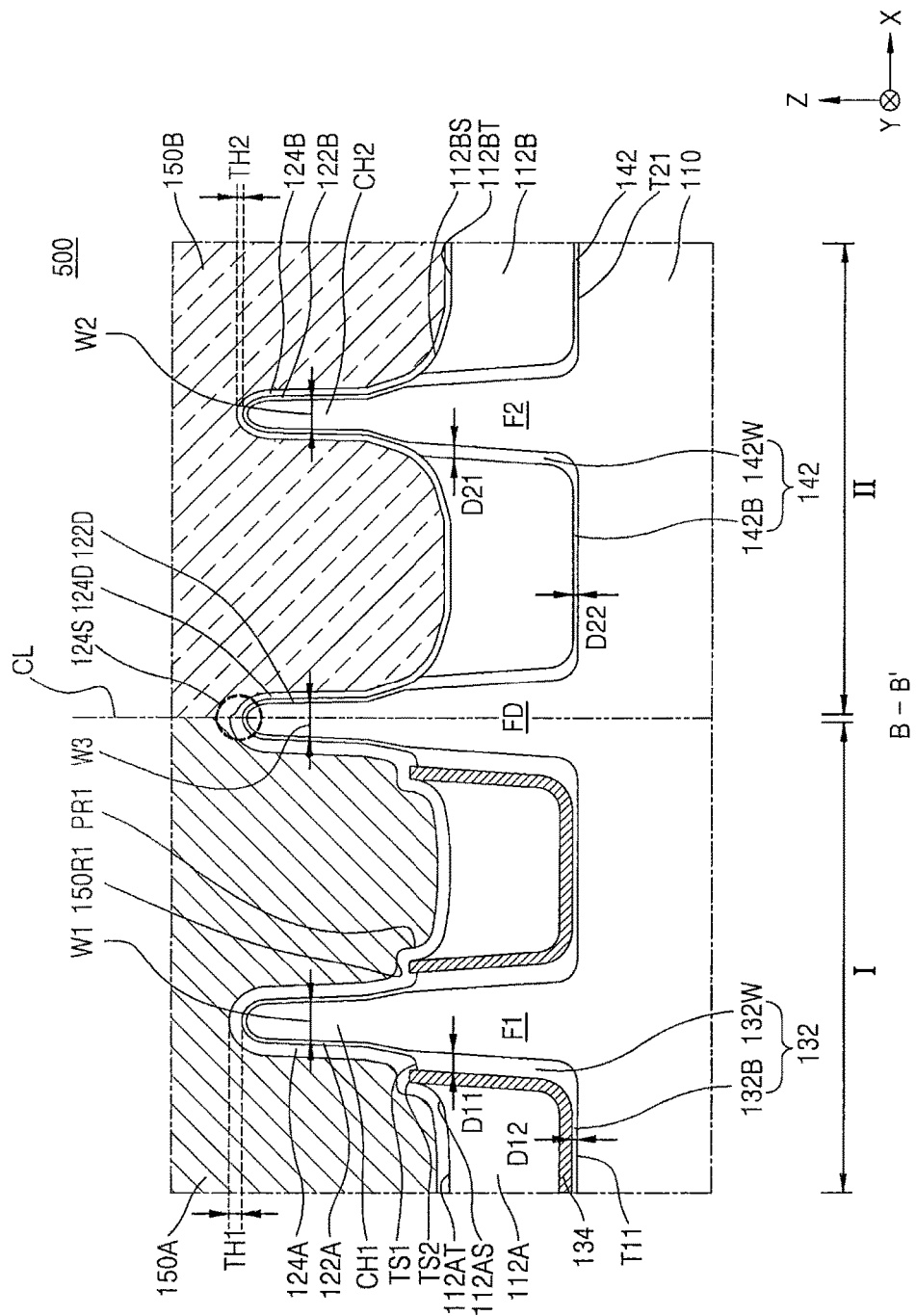
FIG. 5B is a cross section of the integrated circuit device taken along a line B-B' of FIG. 5A.

FIG. 5A is a plan layout diagram of an integrated circuit device 500 according to some embodiments, and FIG. 5B is a cross section of the integrated circuit device 500 taken along a line B-B' of FIG. 5A. In FIGS. 5A and 5B, like reference numerals as those of FIGS. 1A to 4 denote the same elements and, thus, detailed descriptions thereof are omitted.

Referring to FIGS. 5A and 5B, the integrated circuit device 500 includes the substrate 110 having the first region I and the second region II. In the first region I, a plurality of first fin-type active areas F1 protrude from the substrate 110. In each of a plurality of first trenches T11 defining the plurality of first fin-type active areas F1, the insulating liner 134, the stress liner 134, and the first device isolation layer 112A are sequentially formed.

In the second region II, a plurality of second fin-type active areas F2 protrude from the substrate 110. In each of a plurality of second trenches T21 defining the plurality of second fin-type active areas F2, the insulating liner 142 and the second device isolation layer 112B are sequentially formed.

The plurality of first fin-type active areas F1 and the plurality of second fin-type active areas F2 may extend on the substrate 110 along a Y-axis direction in parallel with each other. A dummy fin-type active area FD is formed between the plurality of first fin-type active areas F1 and the plurality of second fin-type active area F2. The dummy fin-type active area FD may extend along a boundary between the first region I and the second region II.

The dummy fin-type active are FD may extend in parallel with the plurality of first fin-type active areas F1 and the plurality of second fin-type active areas F2. In some example embodiments, the plurality of first fin-type active areas F1, the plurality of second fin-type active areas F2, and the dummy fin-type active area FD disposed between the first and second fin-type active areas F1 and F2 may be spaced apart from each other at equal distances.

The first channel region CH1 in each of the plurality of first fin-type active areas F1 formed on the first region I may have a first width W1 in a shorter width direction (X-axis direction) of the first fin-type active areas F1. The second channel region CH2 in each of the plurality of second fin-type active areas F2 formed on the second region II may have a second width W2 that is less than the first width W1 in the shorter width direction (X-axis direction) of the second fin-type active areas F2.

In the dummy fin-type active area FD extending along the boundary between the first region I and the second region II, opposite side walls based on a center line CL that extends along the height direction of the dummy fin-type active area FD may have asymmetric profiles. An upper portion of the dummy fin-type active area FD may have a third width W3 that is less than the first width W1 and greater than the second width W2, in the shorter width direction (X-axis direction).

In FIG. 5A, four first fin-type active areas F1 and four second fin-type active areas F2 are illustrated as an example, but are not limited thereto. For example, in the first region I and the second region II, the number of the first fin-type active areas F1 and the number of the second fin-type active areas F2 may be one or plural, and may be selected variously according to necessity.

On the first region I and the second region II of the substrate 110, a plurality of first gate lines 150A and a plurality of second gate lines 150B may extend a direction (X-axis direction) crossing an extension direction (Y-axis direction) of the plurality of first and second fin-type active areas F1 and F2.

From among the first and second gate lines 150A and 150B, one first gate line 150A and one second gate line 150B extending in a straight line may be integrally connected to each other on the dummy fin-type active area FD or around the dummy fin-type active area FD.

In the first region I, a first interfacial layer 122A and a first gate insulating layer 124A may be disposed between the first channel regions CH1 of the plurality of first fin-type active areas F1 and the plurality of first gate lines 150A. In the second region II, a second interfacial layer 122B and a second gate insulating layer 124B are disposed between the second channel regions CH2 of the plurality of second fin-type active areas F2 and the plurality of second gate lines 150B.

From among the plurality of first and second gate lines 150A and 150B, the first and second gate insulating layers 124A and 124B that are integrally connected to each other may extend in parallel with the first and second gate lines 150A and 150B under the first and second gate lines 150A and 150B that are located side by side along a straight line.

On the first region I, the first gate insulating layer 124 includes the plurality of first protrusions PR1 on portions covering the insulating liner 132 and the stress liner 134. On the second region II, the second gate insulating layer 124B may not include a protrusion around the upper surface of the end portion of the insulating liner 142.

Between the dummy fin-type active area FD extending along the boundary between the first region I and the second region II and the first and second gate lines 150A and 150B covering the dummy fin-type active area FD, a dummy interfacial layer 122D and a dummy gate insulating layer 124D may be disposed. The dummy gate insulating layer 124D may include a portion where the first gate insulating layer 124A and the second gate insulating layer 124B are connected to each other. The dummy gate insulating layer 124D may include a step portion 124S corresponding to a difference between a first thickness TH1 of the first gate insulating layer 124A and a second thickness TH2 of the second gate insulating layer 124B, as denoted by a dotted line on an upper portion of the dummy fin-type active area FD. In FIG. 5B, the step portion 124S of the dummy gate insulating layer 124D is located adjacent to the upper surface of the dummy fin-type active area FD, but is not limited thereto. For example, the step portion 124S of the dummy gate insulating layer 124D may be located on a side wall of the dummy fin-type active area FD, and may be formed out of the dummy fin-type active area FD.

Between opposite lower side walls of the dummy fin-type active area FD, a lower side wall at the first region I side is defined by the first trench T11, and a lower side wall at the second region II side is defined by the second trench T21. Between the opposite lower side walls of the dummy fin-type active area FD, the lower side wall at the first region I side may be covered sequentially by the insulating liner 132, the stress liner 134, and the first device isolation layer 112A formed in the first trench T11. On the other hand, the lower side wall of the dummy fin-type active area FD at the second region II side may be covered sequentially by the insulating liner 142 and the second device isolation layer 112B formed in the second trench T21.

The first protrusions PR1 of the first gate insulating layer 124A may be located adjacent to the side wall of the dummy fin-type active area FD at the first region I side so that the upper surfaces of the end portions of the insulating layer 132 and the stress liner 134 covering the side wall of the dummy fin-type active area FD may be covered by the first protrusions PR1. However, the second gate insulating layer 124B covering the side wall of the dummy fin-type active area FD at the second region II side may not include the protrusion. Accordingly, the first gate insulating layer 124A and the second gate insulating layer 124B covering the opposite side walls of the dummy fin-type active area FD may have asymmetric cross sections based on the dummy fin-type active area FD.

Figure 6:
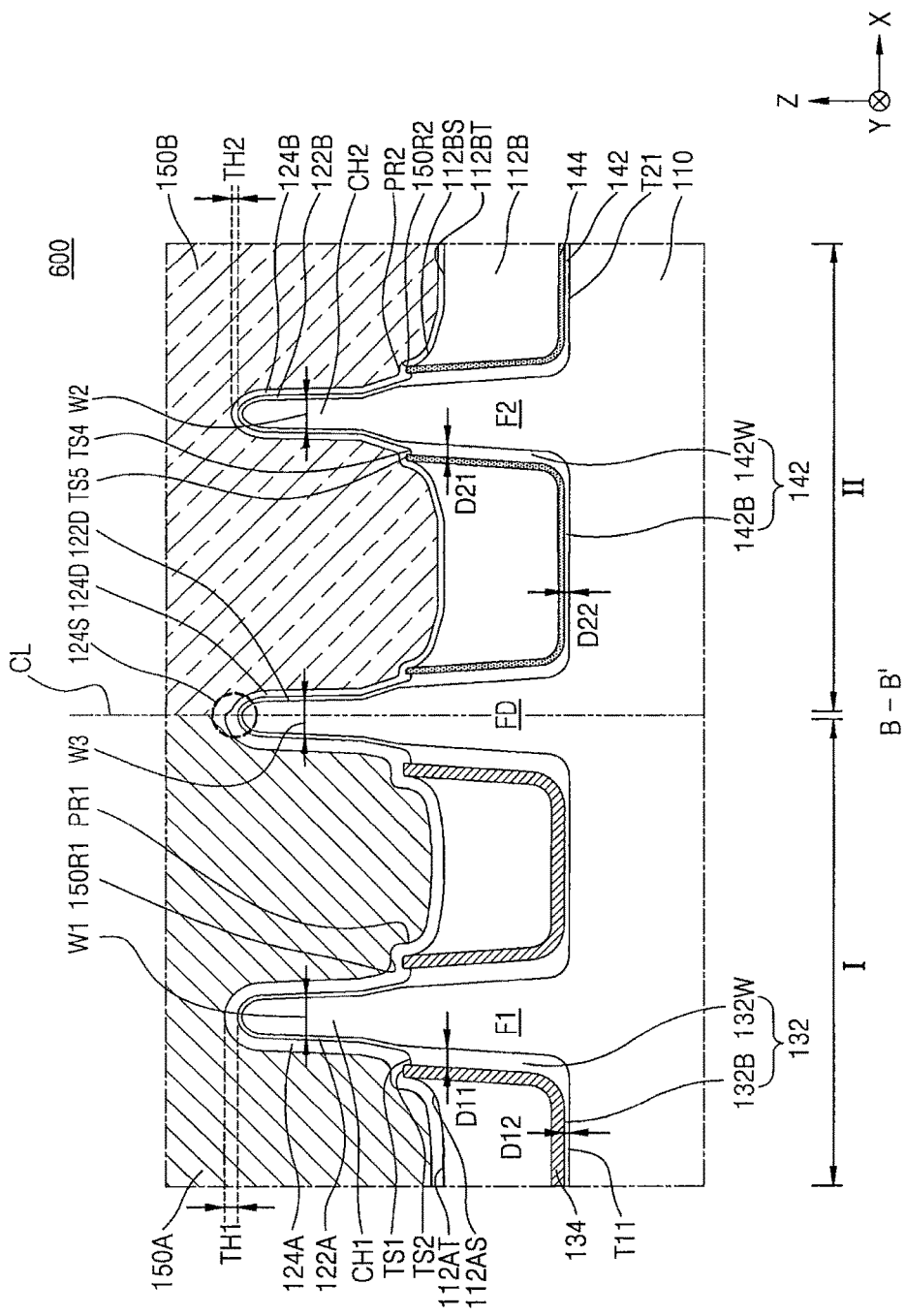
FIG. 6 is a cross section of an integrated circuit device according to some embodiments of the present inventive concept.

FIG. 6 is a cross section of an integrated circuit device 600 according to another example embodiment, taken along a line B-B' of FIG. 5A. In FIG. 6, like reference numerals as those of FIGS. 1A to 5 denote the same elements and, thus, detailed descriptions thereof will be omitted in the interest of brevity.

Referring to FIG. 6, the integrated circuit device 600 has a similar structure to that of the integrated circuit device 500 illustrated above with reference to FIGS. 5A and 5B. However, the integrated circuit device 600 of FIG. 6 further include the stress liner 144 disposed between the insulating liner 142 and the second device isolation layer 112B on the second region II, similarly to the integrated circuit device 400 illustrated above with reference to FIG. 4.

In the integrated circuit device 600, the structure of the first region I is similar to that of FIGS. 5A and 5B. On the second region II, the insulating liner 142, the stress liner 144, and the second device isolation layer 112B are sequentially formed in each of the plurality of second trenches T21 defining the plurality of second fin-type active areas F2.

The dummy fin-type active area FD is formed between a plurality of fin-type active areas F1A formed on the first region and the plurality of second fin-type active areas F2 formed on the second region II. The dummy fin-type active area FD may extend along a boundary between the first region I and the second region II.

Between opposite lower side walls of the dummy fin-type active area FD, the lower side wall at the first region I side is defined by the first trench T11, and the lower side wall at the second region II side may be defined by the second trench T21. Accordingly, the lower side wall of the dummy fin-type active area FD at the first region I side may be covered sequentially by the insulating liner 132, the stress liner 134, and the first device isolation layer 112A formed in the first trench T11. In addition, the lower side wall of the dummy fin-type active area FD at the second region II side may be covered sequentially by the insulating liner 142, the stress liner 144, and the second device isolation layer 112B formed in the second trench T21.

On the first region I, the first gate insulating layer 124A includes the plurality of protrusions PR1 on the portions covering upper end surfaces of the insulating liner 132 and the stress liner 134. On the second region II, the second gate insulating layer 124B includes second protrusions PR2 on portions covering upper end surfaces of the insulating liner 142 and the stress liner 144. The second protrusions PR2 formed on the second region II may be smaller than the first protrusions PR1 formed on the first region I in size.

The first protrusions PR1 formed in the first gate insulating layer 124A may be disposed adjacent to the side wall of the dummy fin-type active area FD at the first region I side. The first protrusions PR1 may cover the upper end surfaces of the insulating liner 132 and the stress liner 134 covering the side wall of the dummy fin-type active area FD at the first region I side, between the opposite side walls of the dummy fin-type active area FD. In addition, the second protrusions PR2 formed in the second gate insulating layer 124B may be disposed adjacent to the side wall of the dummy fin-type active area FD at the second region II side, between the opposite side walls of the dummy fin-type active area FD.

The second protrusions PR2 may cover the upper end surfaces of the insulating liner 142 and the stress liner 144 that cover the side wall of the dummy fin-type active area FD at the second region II side. Due to the difference between the sizes of the first protrusions PR1 and the second protrusions PR2, cross-sectional shapes of the first gate insulating layer 124A and the second gate insulating layer 124B covering the opposite side walls of the dummy fin-type active area FD may be asymmetric based on the dummy fin-type active area FD.

FIGS. 7A to 7I are cross sections illustrating processing steps in the fabrication of integrated devices according to some embodiments of the present inventive concept. Referring to FIGS. 7A to 7I, the example method of manufacturing the integrated circuit device 300 illustrated with reference to FIGS. 3A and 3B will be described below. In FIGS. 7A to 7I, like reference numerals as those of FIGS. 1A to 3B denote the same elements and, thus, detailed descriptions thereof will be omitted in the interest of brevity.

Figure 7A:
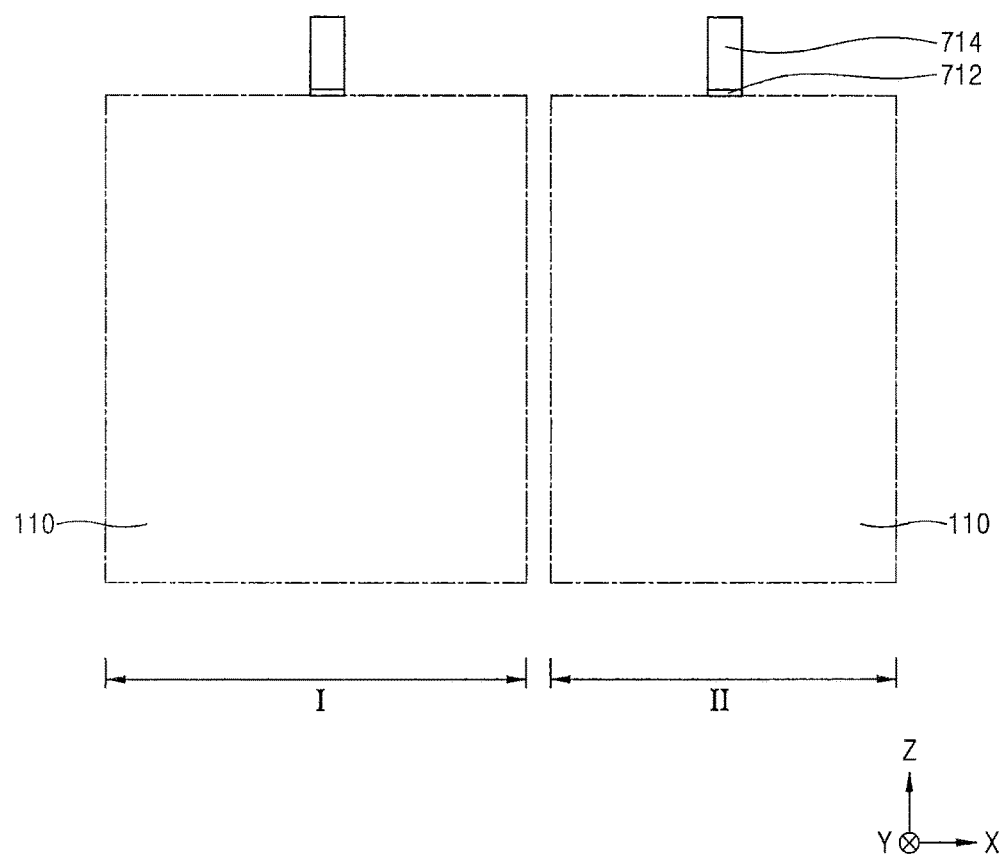
FIGS. 7A to 7I are cross sections illustrating processing steps in the fabrication of an integrated circuit device according to some embodiments of the present inventive concept.

Referring to FIG. 7A, the substrate 110 including the first region I and the second region II is prepared. A plurality of pad oxide layer patterns 712 and a plurality of mask patterns 714 are formed on the first region I and the second region II of the substrate 110.

The plurality of pad oxide layer patterns 712 and the plurality of mask patterns 714 may extend in parallel with each other on the substrate 110 in a direction (Y-axis direction).

In some example embodiments, the plurality of pad oxide layer patterns 712 may include oxide layers obtained by thermally oxidizing a surface of the substrate 110. The plurality of mask patterns 714 may include a silicon oxide layer, a silicon oxynitride layer, a spin on glass (SOG) layer, a spin on hardmask (SOH) layer, a photoresist layer, or a combination thereof, but is not limited thereto.

Figure 7B:
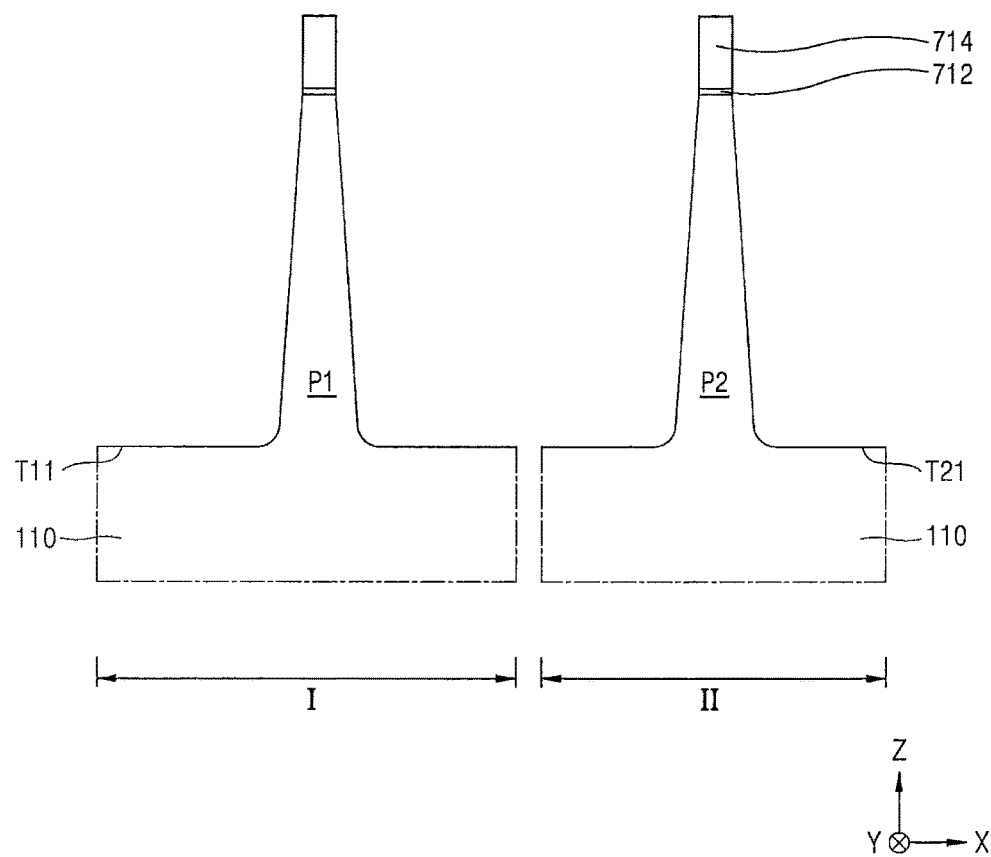

Referring to FIG. 7B, the substrate 110 is partially etched by using the plurality of mask patterns 714 as an etching mask so as to form the plurality of first trenches T11 and the plurality of second trenches T21 in the substrate 110. When the plurality of first and second trenches T11 and T21 are formed, first and second preliminary fin-type active areas P1 and P2 protruding from the substrate 110 in a direction (Z-axis direction) perpendicular to a main surface of the substrate 110 and extending in a direction (Y-axis direction) may be obtained.

Figure 7C:
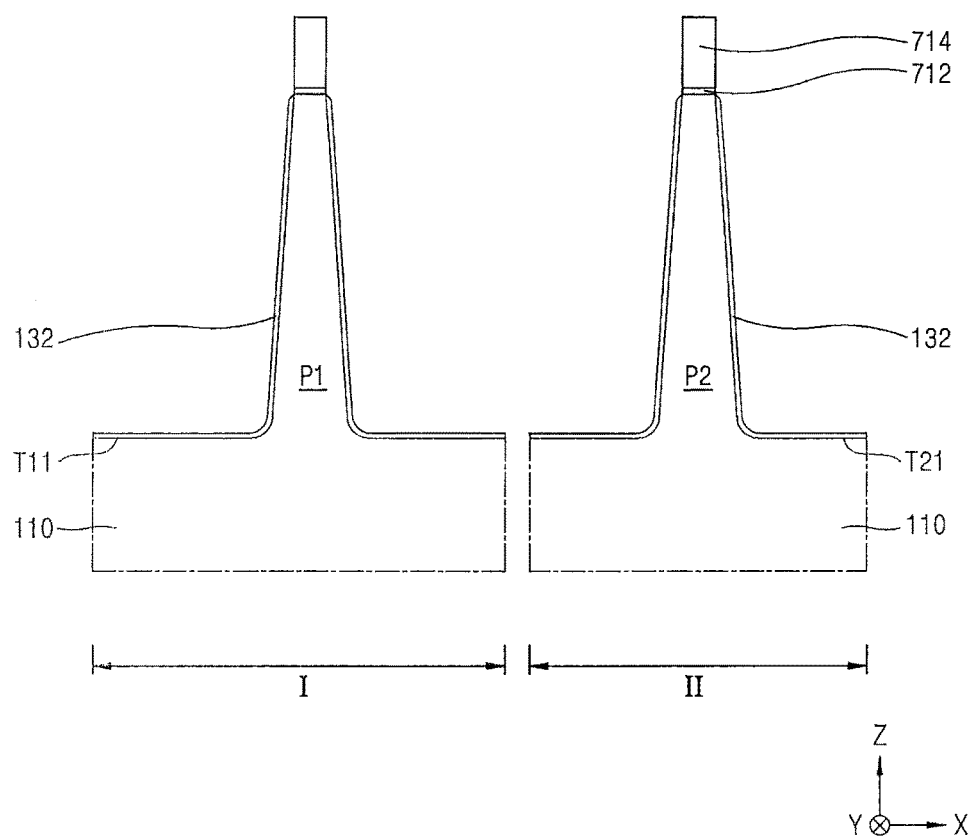

Referring to FIG. 7C, the insulating liner 132 covering exposed surfaces of the first and second preliminary fin-type active areas P1 and P2 is formed on the first region I and the second region II.

The insulating liner 132 may be obtained by oxidizing surfaces of the first and second preliminary fin-type active areas P1 and P2. While the insulating liner 132 is formed, the first and second preliminary fin-type active areas P1 and P2 may be consumed due to oxidation from the surfaces thereof to a predetermined depth. In some example embodiments, the insulating liner 132 may be formed by a thermal oxidation process. In some other example embodiments, the insulating liner 132 may be formed by an in-situ steam generation (ISSG) process using a mixture of $H_2$ gas and $O_2$ gas. However, processes for forming the insulating liner 132 are not limited to the above examples. In some example embodiments, the insulating liner 132 may be formed to a thickness of about 10 Å to about 100 Å.

Figure 7D:
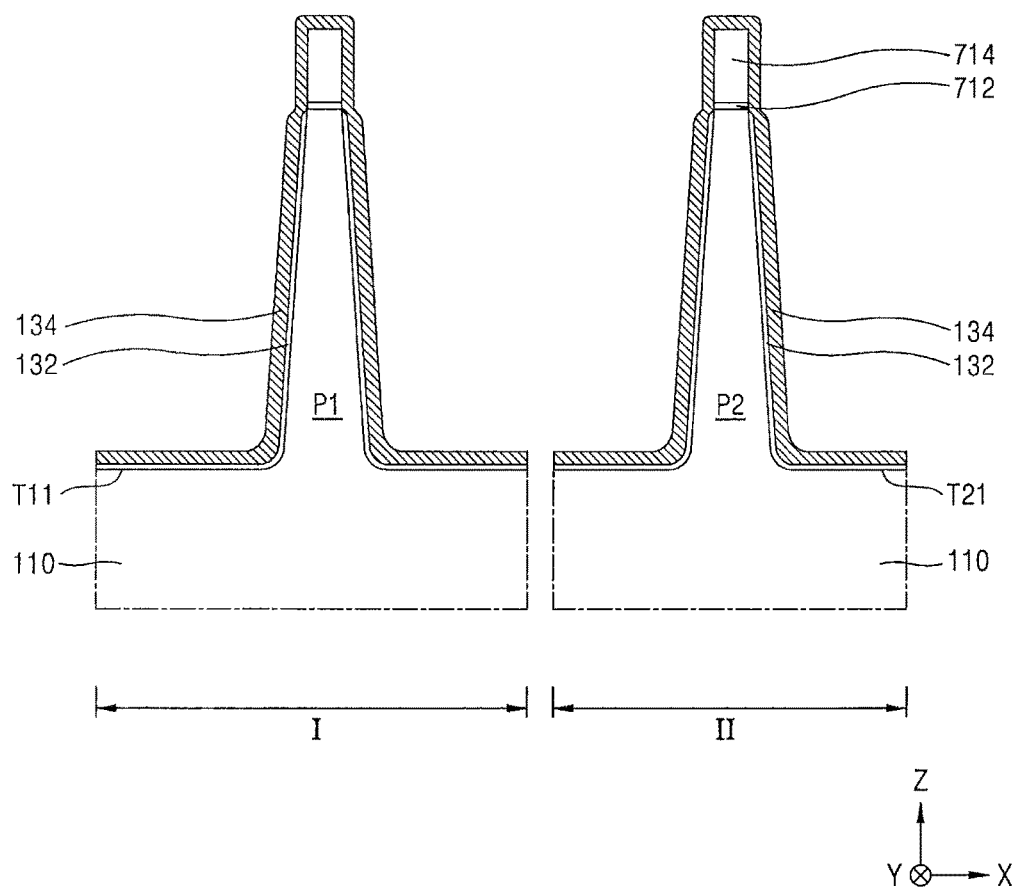

Referring to FIG. 7D, the stress liner 134 is formed on the insulating liner 132 on the first region I and the second region II. The stress liner 134 may have a constant thickness to conformally cover the insulating liner 132.

When an NMOS transistor is to be formed on the first region I, the stress liner 134 may include a material that applies a tensile stress to the first channel region CH1 of the first fin-type active area F1 (see FIG. 3B) that will be formed by a post-process. For example, the stress liner 134 may include, for example, SiN, SiON, SiBN, SiC, SiC:H, SiCN, SiCN:H, SiOCN, SiOCN:H, SiOC, $SiO_2$, polysilicon, or a combination thereof. In some example embodiments, the stress liner 134 may be formed to a thickness of about 10 Å to about 100 Å.

In some example embodiments, the stress liner 134 may be formed by a plasma enhanced chemical vapour deposition (PECVD) process, a high density plasma CVD (HDP CVD) process, an inductively coupled plasma CVD (ICP CVD) process, or a capacitor coupled plasma CVD (CCP CVD) process.

Figure 7E:
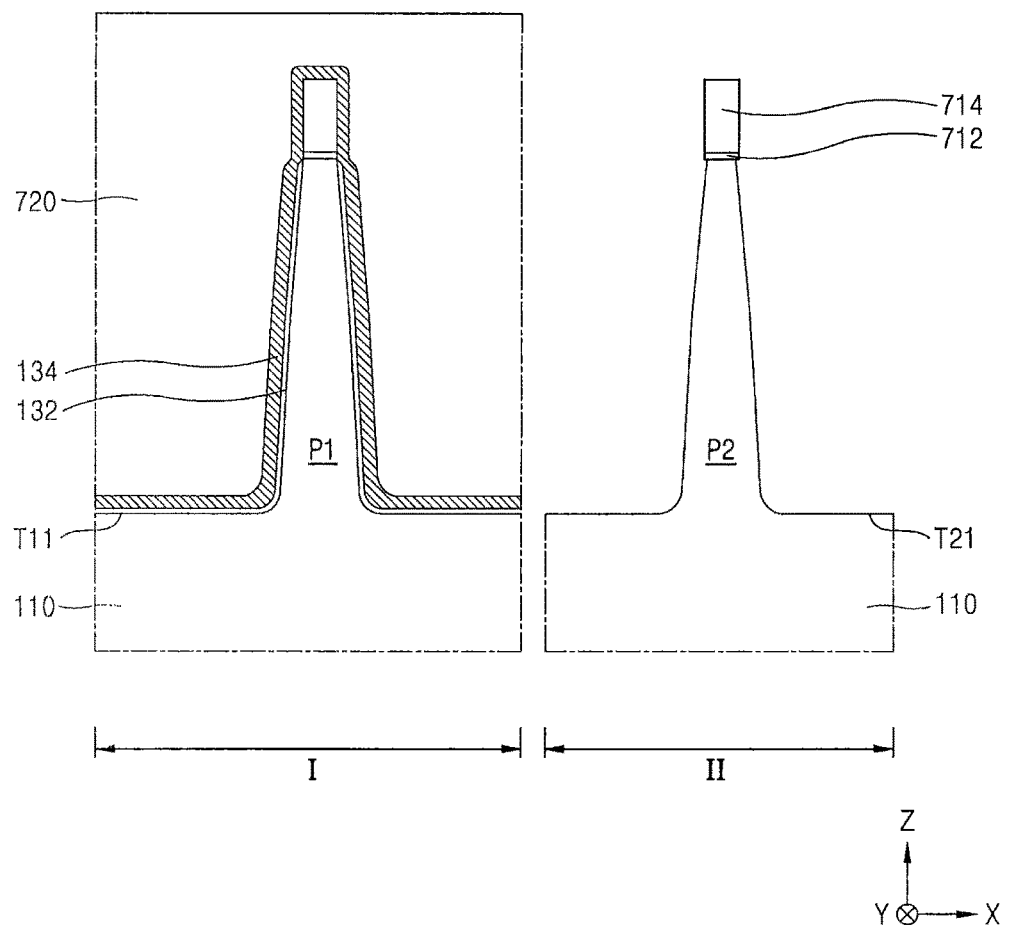

Referring to FIG. 7E, a mask pattern 720 covering the first region I is formed on the substrate 110 so as to expose the second region II, and the stress liner 134 and the insulating liner 132 are removed on the second region II to expose the second preliminary fin-type active area P2.

In some example embodiments, while an etching process for removing the stress liner 134 and the insulating liner 132 is performed on the second region II, the second preliminary fin-type active area P2 is consumed partially from the exposed surface thereof due to the etching atmosphere, thereby reducing a width of the second preliminary fin-type active area P2.

Figure 7F:
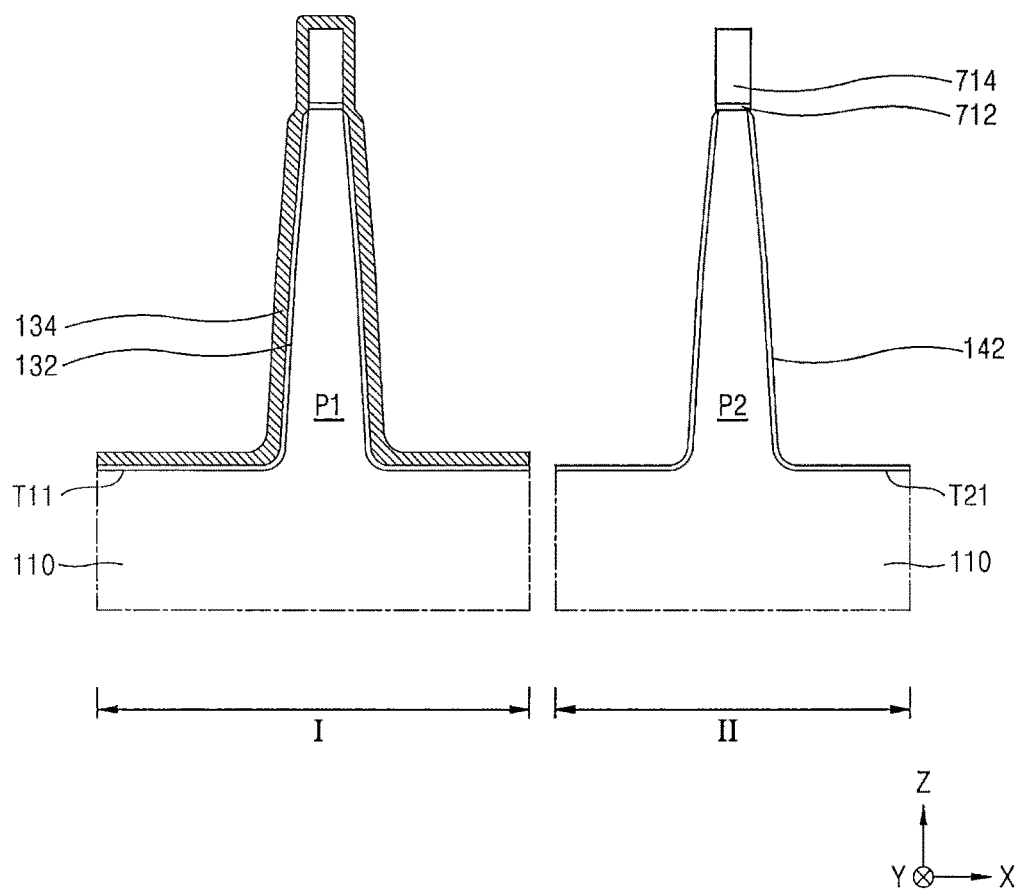

Referring to FIG. 7F, the insulating liner 142 is formed on the exposed surface of the second preliminary fin-type active area P2 on the second region II, and after that, the mask pattern 720 remaining on the first region I is removed to expose the stress liner 134 from the first region I.

The insulating liner 142 may be obtained by oxidizing the surface of the second preliminary fin-type active area P2. In some example embodiments, the insulating liner 142 may be formed by a thermal oxidation process. While the insulating liner 142 is formed, the second preliminary fin-type active area P2 may be consumed from the surface thereof to a predetermined depth. In some other example embodiments, the insulating liner 142 may be formed by an ISSG process using a mixture of $H_2$ gas and $O_2$ gas. However, the process for forming the insulating liner 142 is not limited to the above examples. In some example embodiments, the insulating liner 142 may be formed to a thickness of about 10 Å to about 100 Å.

Figure 7G:
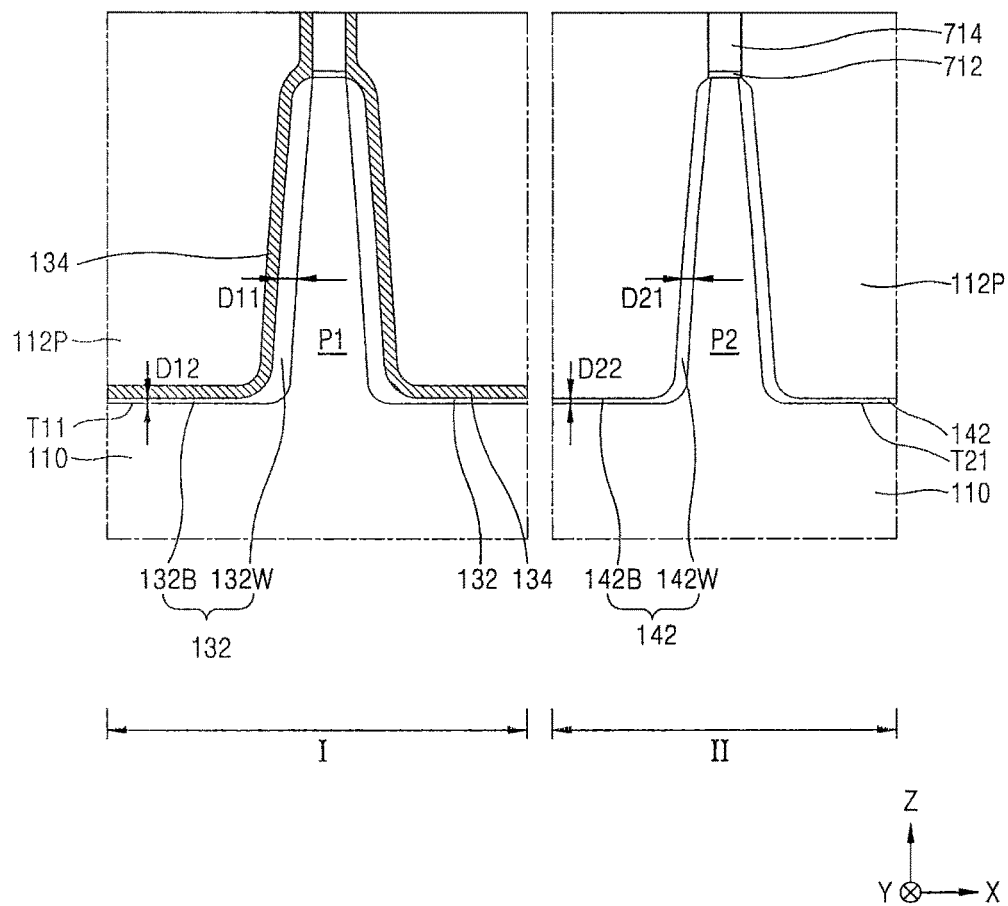

Referring to FIG. 7G, a preliminary device isolation layer 112P filling the first trenches T11 and the second trenches T21 is formed on the first region I and the second region II.

In order to form the preliminary device isolation layer 112P, an oxide material is deposited to fill the plurality of first and second trenches T11 and T21, and annealed so as to solidify and densify the deposited oxide material.

The preliminary device isolation layer 112P may be formed by a flowable chemical vapor deposition (FCVD) process or a spin coating process. For example, the preliminary device isolation layer 112P may include FSG, USG, BPSG, PSG, FOX, PE-TEOS, or TOSZ.

In order to perform the annealing process of the preliminary device isolation layer 112P, a furnace or a rapid thermal processing (RTP) chamber may be used. For example, the annealing of the preliminary device isolation layer 112P may be performed for a few seconds to a few minutes at a temperature of about 700° C. to about 1100° C. by using the RTP chamber.

During annealing the preliminary device isolation layer 112P, the insulating liners 132 and 142 on the first and second regions I and II are partially oxidized, thereby increasing thickness of some parts of the insulating liners 132 and 142. In particular, the portions of the insulating liners 132 and 142, which cover side walls of the first and second preliminary fin-type active areas P1 and P2, are more likely to be affected by the annealing atmosphere, and thus, the thicknesses thereof may be relatively largely increase due to the oxidation. In these embodiments, at least some parts of the first preliminary fin-type active area P1, the second preliminary fin-type active area P2, and the stress liner 134 may be consumed from the surfaces thereof to predetermined depths due to the oxidation. Portions of the insulating liners 132 and 142, which cover the bottom surfaces of the first and second trenches T11 and T21, are less likely to be affected by the annealing atmosphere. Accordingly, the thicknesses of the portions may be less increased due to the oxidation of the insulating liners 132 and 142.

Accordingly, after annealing the preliminary device isolation layer 112P, the insulating liner 132 on the first region I may have a structure including the side wall extension 132W disposed between the first preliminary fin-type active area P1 and the stress liner 134 and having the first thickness D11, and the bottom extension 132B disposed between the bottom surface of the first trench T11 and the stress liner 134 and having the second thickness D12 that is less than the first thickness D11. In the first trench T11, the stress liner 134 may have a constant thickness.

In addition, on the second region II, the insulating liner 142 may have a structure including the side wall extension 142W disposed between the second preliminary active area P2 and the preliminary device isolation layer 112P and having the first thickness D21, and the bottom extension 142B disposed between the bottom surface of the second trench T21 and the preliminary device isolation layer 112P and having the second thickness D22 that is less than the first thickness D21.

After performing the annealing process of the preliminary device isolation layer 112P, an upper portion of the preliminary device isolation layer 112P is partially removed to expose upper surfaces of the plurality of mask patterns 714.

Figure 7H:
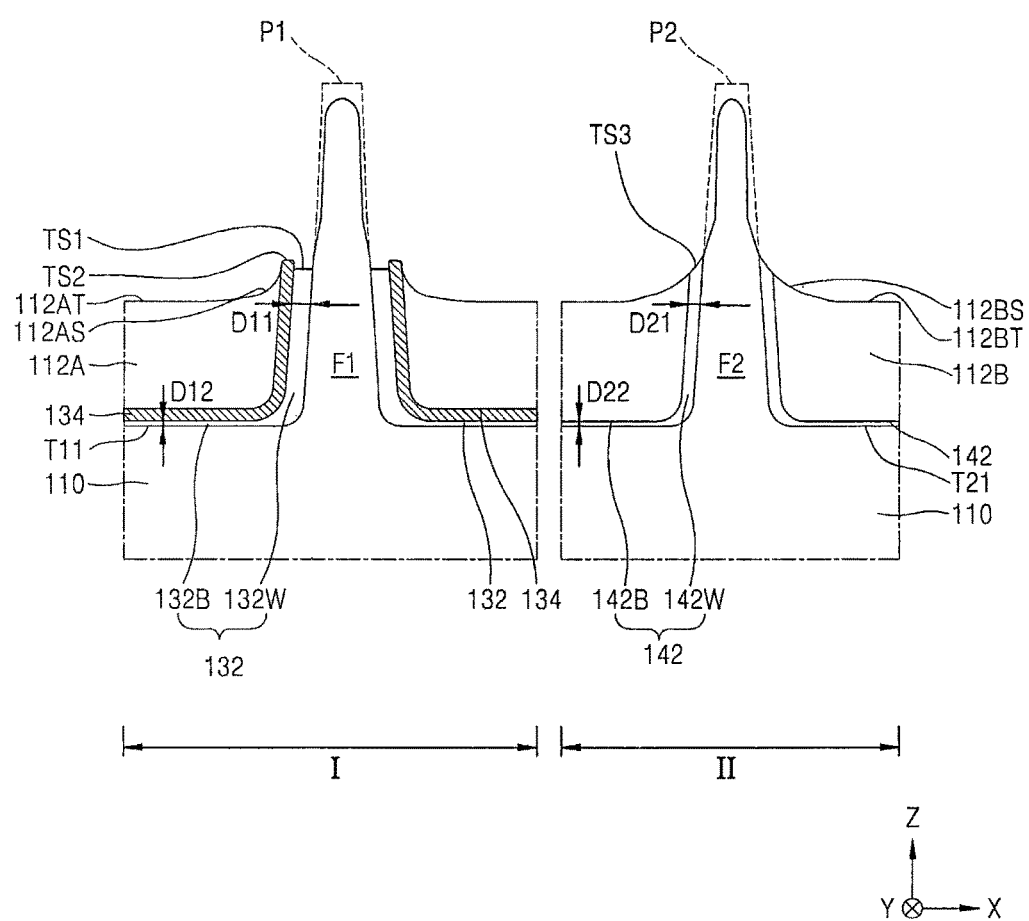

Referring to FIG. 7H, the plurality of mask patterns 714 and the plurality of pad oxide layer patterns 712 (see FIG. 7G) are removed to expose upper surfaces and side walls of the first and second preliminary fin-type active areas P1 and P2, and a recess process is performed to partially remove the preliminary device isolation layer 112P, the insulating liners 132 and 142, and the stress liner 134.

Accordingly, the first and second device isolation layers 112A and 112B having reduced heights are obtained on the first and second regions I and II, and the first and second fin-type active areas F1 and F2 may be obtained from the first and second preliminary fin-type active areas P1 and P2.

In some example embodiments, a dry etching, a wet etching, or a combination of the dry etching and the wet etching may be used to perform the recess process.

When the plurality of mask patterns 714 includes the silicon nitride layers, the wet etching process using, for example, $H_3PO_4$, may be performed in order to remove the plurality of mask patterns 714. In order to remove the plurality of pad oxide layer patterns 712, the wet etching process using, for example, diluted HF (DHF), may be performed.

In some example embodiments, for performing the recess process of the preliminary device isolation layer 112P, a wet etching process using $NH_4OH$, tetramethyl ammonium hydroxide (TMAH), potassium hydroxide (KOH) solution, etc. as an etchant, or a dry etching process such as an ICP process, a TCP process, an electron cyclotron resonance (ECR) process, a reactive ion etching (RIE) process, etc. When the recess process of the preliminary device isolation layer 112P is performed through the dry etching process, a fluorine containing gas such as $CF_4$, a chlorine containing gas such as $Cl_2$, HBr, etc., but is not limited thereto.

During performing the recess process, upper portions of the first and second preliminary fin-type active areas P1 and P2 (see FIG. 7G) exposed on the first and second regions I and II may be exposed to an etching atmosphere such as plasma and/or a cleaning atmosphere of a post-process. Accordingly, the upper portions of the first and second preliminary fin-type active areas P1 and P2 that are exposed to the etching, the oxidation, and/or the cleaning atmosphere are partially consumed, and as shown in FIG. 7H, the first and second fin-type active areas F1 and F2 having upper portions of reduced widths may be obtained. In particular, since the second fin-type active area F2 undergoes the recess process additionally in a state where the outer surface of the second preliminary fin-type active area P2 has been partially removed during the etching process illustrated with reference to FIG. 7E, the width of the upper portion of the second fin-type active area F2 may be further reduced than that of the upper portion of the first fin-type active area F1.

During performing the recess process on the first region I and the second region II, an etching amount of the preliminary device isolation layer 112P on the center portions of the first and second trenches T11 and T21 may be greater than that on the peripheral portions of the center portion. Therefore, after finishing the recess process, the first device isolation layer 112A having a concave upper surface 112AT may be obtained on the first region I, and the second device isolation layer 112B having a concave upper surface 112BT may be obtained on the second region II.

The stress liner 134 on the first region I may have an etch selectivity ratio that is less than that of the preliminary device isolation layer 112P, under the etching atmosphere during the recess process. Then, the stress liner 134 having the second upper surface TS2 at a higher level than that of the upper surface 112AT of the first device isolation layer 112A may remain. Furthermore, since the insulating liner 132 disposed between the first fin-type active area F1 and the stress liner 134 on the first region I is disposed in a relatively narrow gap between the first fin-type active area F1 and the stress liner 134, the insulating liner 132 may be less affected by the etching atmosphere than the preliminary device isolation layer 112P during the recess process of the preliminary device isolation layer 112P. Therefore, the etching amount of the insulating liner 132 may be greater than that of the stress liner 134 and may be less than that of the preliminary device isolation layer 112P. Accordingly, after finishing the recess process, the first upper surface TS1 of the insulating liner 132 may be lower than the second upper surface TS2 of the stress liner 134 and may be higher than the upper surface 112AT of the first device isolation layer 112A.

However, on the second region II, the etching amounts of the preliminary device isolation layer 112P and the insulating liner 142 during the recess process may be similar to each other, or may have a very small. Accordingly, the upper surface 112BT of the second device isolation layer 112B may continuously extend from the third upper surface TS3 of the insulating liner 142 without generating a step.

In some example embodiments, an impurity ion implantation process for adjusting threshold voltages may be performed on the upper portions of the first and second fin-type active areas F1 and F2, which are exposed on the first and second regions I and II. During the impurity ion implantation process for adjusting the threshold voltage, boron (B) ions are implanted into one of the first and second regions I and II, on which the NMOS transistor is to be formed, and phosphor (P) or arsenide (As) ions may be implanted into one of the first and second regions I and II, on which the PMOS transistor is to be formed.

Figure 7I:
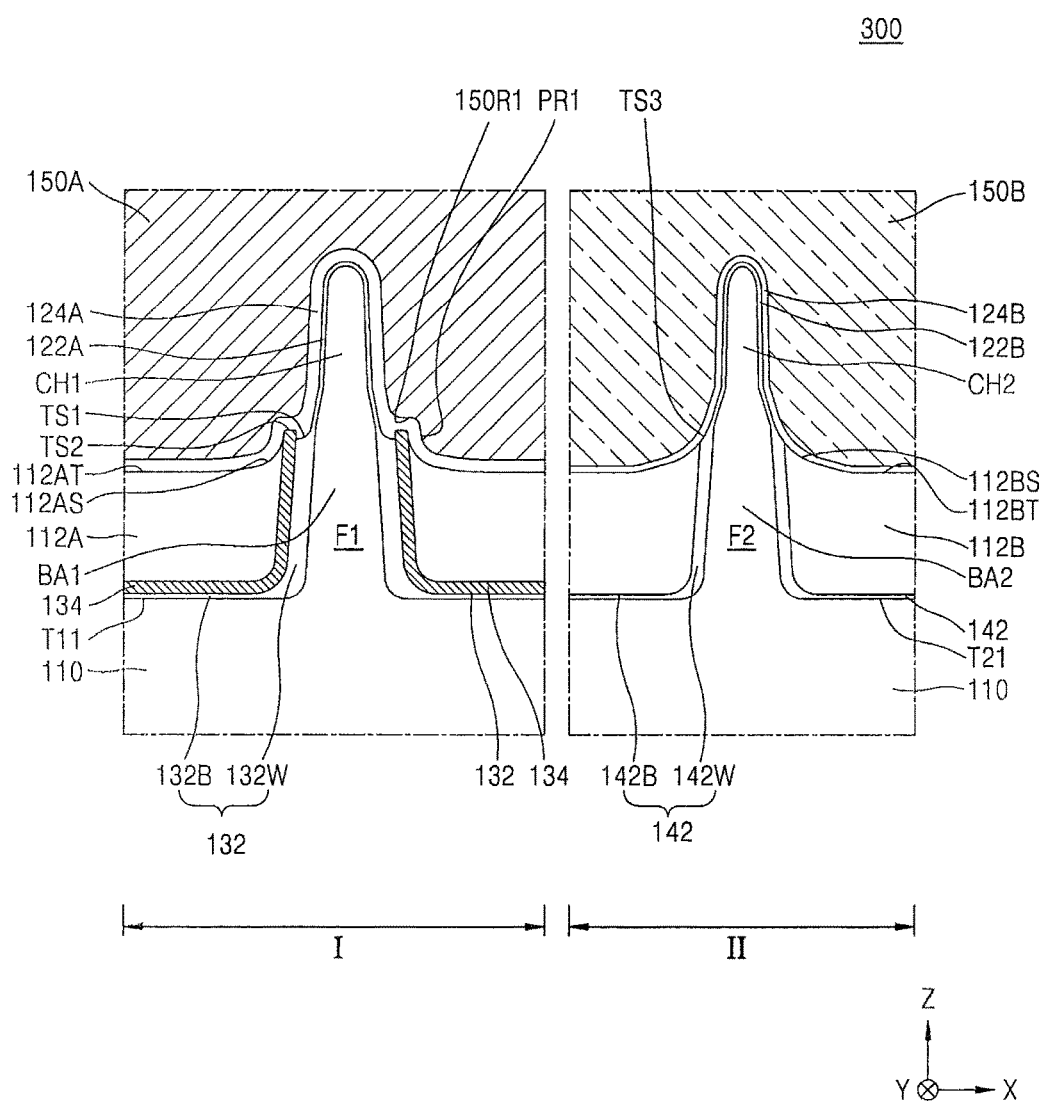

Referring to FIG. 7I, the first and second interfacial layers 122A and 122B, the first and second gate insulating layers 124A and 124B, and the first and second gate lines 150A and 150B covering the exposed surfaces of the first and second fin-type active areas F1 and F2 respectively on the first and second regions I and II, and the first and second source/drain regions 162A and 162B (see FIG. 3A) are formed to manufacture the integrated circuit device 300 illustrated with reference to FIGS. 3A and 3B.

In some example embodiments, a replacement poly-gate (RPG) process may be used to form the first and second interfacial layers 122A and 122B, the first and second gate insulating layers 124A and 124B, and the first and second gate lines 150A and 150B. The upper portions of the first and second fin-type active areas F1 and F2 may respectively form the first channel region CH1 and the second channel region CH2.

In order to form the first and second gate insulating layers 124A and 124B having different thickness from each other on the first region I and the second region II, the first and second interfacial layers 122A and 122B covering the exposed surfaces of the first and second fin-type active areas F1 and F2 on the first and second regions I and II are formed first, and then, the first gate insulating layer 124A that continuously extend from the upper portions of the first and second interfacial layers 122A and 122B respectively to the upper portions of the first and second device isolation layers 112A and 112B may be formed on the first and second regions I and II. After that, the first gate insulating layer 124A is partially removed from the upper surface thereof to a predetermined depth selectively on the second region II to form the second gate insulating layer 124B having a reduced thickness.

The first gate insulating layer 124A formed on the first region I has the first protrusions PR1 on the portions covering the first upper surface TS1 of the insulating liner 132 and the second upper surface TS2 of the stress liner 134. While the first gate insulating layer 124A is formed, the first protrusions PR1 may be generated due to the difference between the heights of the first upper surface TS1 of the insulating liner 132, the second upper surface TS2 of the stress liner 134, and the upper surface 112AT of the first device isolation layer 112A. The first protrusions PR1 may be disposed on opposite sides of the first fin-type active area F1. The first gate line 150A may be formed to include the recess surface portions 150R1 corresponding to the first protrusions PR1, on the portions thereof facing the first protrusions PR1 of the first gate insulating layer 124A, at locations adjacent to the first upper surface TS1 of the insulating liner 132 and the second upper surface TS2 of the stress liner 134.

On the second region II, a step is rarely seen between the upper surface 112BT of the second device isolation layer 112B and the third upper surface TS3 of the insulating liner 142. Accordingly, the second gate insulating layer 124B may not include a protrusion on the boundary between the upper surface 112BT of the second device isolation layer 112B and the third upper surface TS3 of the insulating liner 142.

According to the method of manufacturing the integrated circuit device 300 illustrated with reference to FIGS. 7A to 7I, the first and second regions I and II having the channel regions having different conductivity types have the liners of different configurations, wherein the liners cover the lower side walls of the first and second fin-type active areas F1 and F2, and the first and second gate insulating layers 124A and 124B covering the first and second channel regions CH1 and CH2 of the first and second fin-type active areas F1 and F2 and the upper end surfaces of the liners are different on the first and second regions I and II. Accordingly, when the fin FETs that are highly downscaled having the channel regions of different conductivity types are formed on the plurality of regions of the substrate, optimal operating characteristics suitable for each of the transistors formed on the plurality of regions may be obtained, thereby improving performance of the transistors.

The method of manufacturing the integrated circuit device 300 illustrated in FIGS. 3A and 3B is described above with reference to FIGS. 7A to 7I, but integrated circuit devices of various structures example shown in the specification, for example, the integrated circuit device 100 of FIGS. 1A and 1B, the integrated circuit device 200 of FIG. 2, the integrated circuit device 400 of FIG. 4, the integrated circuit device 500 of FIGS. 5A and 5B, the integrated circuit device 600 of FIG. 6, and the other modified integrated circuit devices may be implemented by using various modified methods within the scope of the inventive concept.

For example, in order to manufacture the integrated circuit device 200 of FIG. 2, the shallow trench ST is formed in the substrate 110, and after that, a deep trench DT is formed in a similar manner as that illustrated with reference to FIGS. 7A and 7B to define a pair of fin-type active areas FAs. After that, the insulating liner 132, the stress liner 134, and the device isolation layer 112 may be formed in the shallow trench ST and the deep trench DT in the similar manner as that illustrated with reference to FIGS. 7C to 7H about the first region I. Here, the insulating liner 132 formed in the shallow trench ST may be formed to have a roughly constant thickness at a portion covering the side wall of the shallow trench ST and at a portion covering the bottom surface of the shallow trench ST. Accordingly, as illustrated in FIG. 2, the third thickness D3 of the insulating liner 132 on the bottom surface of the shallow trench ST may be greater than the second thickness D2 of the bottom extension 132B covering the bottom surface of the deep trench DT.

In the processes of manufacturing the integrated circuit device 200 of FIG. 2, in order to form the third thickness D3 of the insulating layer 132 on the bottom surface of the shallow trench ST to be greater than the second thickness D2 of the bottom extension 132B on the bottom surface of the deep trench DT, the annealing processing condition of the preliminary device isolation layer 112P illustrated with reference to FIG. 7G, and sizes of the shallow trench ST and the deep trench DT may be adjusted. For example, the bottom surface of the shallow trench ST may have a width less than that of the bottom surface of the deep trench DT in a width direction (X-axis direction) of the shallow trench ST and the deep trench DT. In this case, while performing the annealing process of the preliminary device isolation layer 112P, oxidation of the insulating liner 132 is performed on the bottom surface of the shallow trench ST within a narrower space than the deep trench DT, and accordingly, on the bottom surface of the shallow trench ST, the portion of the insulating liner 132 covering the side walls of the shallow trench ST, as well as the portion of the insulating liner 132 covering the bottom surface of the shallow trench ST, increase in thicknesses simultaneously due to the oxidation. Accordingly, the thickness of the insulating liner 132 may increase more on the bottom surface of the shallow trench ST defining the narrow space than on the deep trench DT.

In order to manufacture the integrated circuit device 400 of FIG. 4, the processes are performed to the step of forming the insulating liner 142 on the exposed surface of the second preliminary fin-type active area P2 on the second region II as illustrated with reference to FIG. 7A to 7F, and after that, a process of forming the stress liner 144 on the insulating liner 142 may be further performed on the second region II before removing the mask pattern 720 remaining on the first region I.

The stress liner 144 may include the same material as that included in the stress liner 134, or may include a different material from that included in the stress liner 134. However, the stress liner 144 may include a smaller thickness than that of the stress liner 134 formed on the first region I. As such, after performing the recess process of the preliminary device isolation layer 112P as described with reference to FIG. 7H, the fifth height H5 of the fifth upper surface TS5 of the stress liner 144 formed on the second region II may be lower than the height of the second upper surface TS2 of the stress liner 134 formed on the first region I. In addition, the difference between the upper surface TS4 of the insulating liner 142 and the fifth upper surface TS5 of the stress liner 144 on the second region II may be less than the difference between the first upper surface TS1 of the insulating liner 132 and the second upper surface TS2 of the stress liner 134 on the first region I. Accordingly, when the second gate insulating layer 124B is formed on the second region II in the similar manner to that of FIG. 7I, the second protrusions PR2 covering the fourth upper surface TS4 of the insulating liner 142 and the fifth upper surface TS5 of the stress liner 144 may be formed as illustrated in FIG. 4. In addition, the second gate line 150B may include the recess surface portions 150R2 corresponding to the protrusions PR2 on the portions facing the second protrusions PR2.

The example methods of manufacturing the integrated circuit device according to one or more example embodiments are described above. However, one of ordinary skill in the art would appreciate that the integrated circuit devices 100, 200, 300, 400, 500, and 600 illustrated in FIGS. 1A to 6 and integrated circuit devices having various structures modified and changed therefrom may be manufactured by the various manufacturing methods within the scope of the inventive concept.

Figure 8:
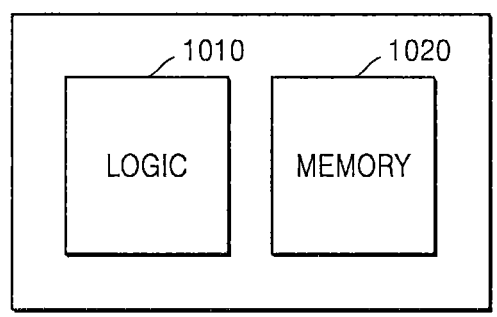
FIG. 8 is a block diagram of an electronic device according to some embodiments of the present inventive concept.

Referring now to FIG. 8, a block diagram of an electronic device 1000 according to some embodiments of the present inventive concept will be discussed. As illustrated in FIG. 8, the electronic device 1000 includes a logic area 1010 and a memory area 1020.

The logic area 1010 may include various kinds of logic cells including a plurality of circuit elements such as transistors, registers, and the like, as standard cells performing desired logic functions such as a counter, a buffer, and the like. The logic cell may configure, e.g., AND, NAND, OR, NOR, XOR (exclusive OR), XNOR (exclusive NOR), INV (inverter), ADD (adder), BUF (buffer), DLY (delay), FILL (filter), multiplexer (MXT/MXIT). OAI (OR/AND/INVERTER), AO (AND/OR), AOI (AND/OR/INVERTER), D flip-flop, reset flip-flop, master-slaver flip-flop, latch, and the like. However, the logic cells according to the one or more example embodiments are not limited to the above examples.

The memory area 1020 may include at least one of SRAM, DRAM, MRAM, RRAM, and PRAM. The logic area 1010 and the memory area 1020 may respectively include at least one of the integrated circuit devices 100, 200, 300, 400, 500, and 600 illustrated in FIGS. 1A to 6 and other integrated circuit devices having various structures modified and changed from the above integrated circuit devices 100, 200, 300, 400, 500, and 600. In some example embodiments, the memory area 1020 may include at least one of the integrated circuit devices 100, 200, 300, and 400 illustrated in FIGS. 1A to 4 and the integrated circuit devices having various structures that are modified and changed therefrom.

Figure 9:
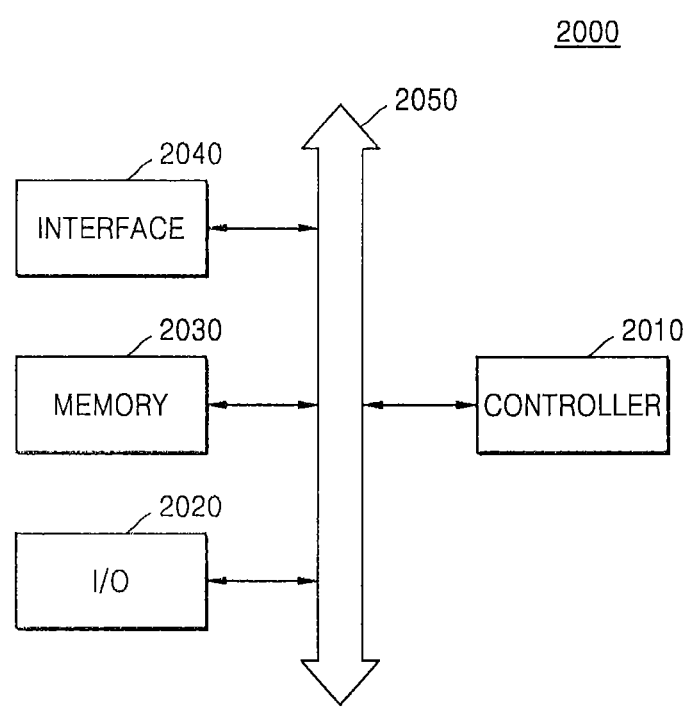
FIG. 9 is a block diagram of an electronic system according to some embodiments of the present inventive concept.

Referring now to FIG. 9, a block diagram of an electronic system 2000 according to some embodiments of the present inventive concept will be discussed. As illustrated in FIG. 9, the electronic system 2000 includes a controller 2010, an input/output (I/O) device 2020, a memory 2030, and an interface 2040 that are connected to one another via a bus 2050.

The controller 2010 may include at least one of a microprocessor, a digital signal processor, and other similar processors. The I/O device 2020 may include at least one of a keypad, a keyboard, and a display. The memory 2030 may be used to store a command executed by the controller 2010. For example, the memory 2030 may be used to store user data.

The electronic system 2000 may configure a wireless communication device, or a device capable of transmitting and/or receiving information under a wireless communication environment. The interface 2040 may include a wireless interface in order to transmit/receive data via a wireless communication network in the electronic system 2000. The interface 2040 may include an antenna and/or a wireless transceiver. In some example embodiments, the electronic system 2000 may be used for a communication interface protocol of a third-generation communication system, e.g., code division multiple access (CDMA), global system for mobile communications (GSM), north American digital cellular (NADC), extended-time division multiple access (E-TDMA), and/or wide band code division multiple access (WCDMA). The electronic system 2000 includes at least one of the integrated circuit devices 100, 200, 300, 400, 500, and 600 illustrated in FIGS. 1A to 6, and various integrated circuit devices having various structures modified or transformed within the scope of the inventive concept.

While the inventive concept has been particularly shown and described with reference to example embodiments thereof, it will be understood that various changes in form and details may be made therein without departing from the spirit and scope of the following claims.

What is claimed is:

1. An integrated circuit device comprising:
    a pair of fin-type active areas protruding from a substrate and extending in parallel to each other in a first direction;
    a plurality of liners sequentially covering lower side walls of the pair of the fin-type active areas;
    a device isolation layer covering the lower side walls of the pair of fin-type active areas with the plurality of liners interposed between the device isolation layer and the lower side walls of the pair of fin-type active areas, wherein an upper surface of the device isolation layer has an inclined edge portion and a concave center portion between the pair of fin-type active areas;
    a gate insulating layer extending to cover channel regions of the pair of fin-type active areas, the plurality of liners, and the device isolation layer, and comprising a plurality of protrusions located on portions of the gate insulating layer which cover the plurality of liners; and
    a gate line on the gate insulating layer, the gate line covering the channel regions of the pair of fin-type active areas, the plurality of liners, and the device isolation layer, and extending in a second direction crossing the first direction,
    wherein the gate insulating layer on the device isolation layer has a structure that is closer to the substrate as a distance from each of the pair of fin-type active areas increases.

2. The integrated circuit device of claim 1, wherein the gate line on the device isolation layer has a structure that is closer to the substrate as a distance from each of the pair of fin-type active areas increases.

3. The integrated circuit device of claim 1, wherein the device isolation layer has a sidewall contacting the plurality of liners, wherein the sidewall of the device isolation layer has a highest point at a first height from the substrate, and the first height is lower than a top surface of the plurality of liners.

4. An integrated circuit device comprising:
    a first fin-type active area protruding from a first region of a substrate and comprising a first channel region of a first conductivity type;
    a plurality of liners covering lower side walls of the first fin-type active area on the first region;
    a first device isolation layer covering the lower side walls of the first fin-type active area, wherein the plurality of liners are between the first device isolation layer and the lower side walls of the first fin-type active area on the first region;
    a first gate insulating layer on the first region, the first gate insulating layer extending to cover the first channel region of the first fin-type active area, the plurality of liners, and the first device isolation layer, and comprising first protrusions located on portions of the first gate insulating layer which cover the plurality of liners;
    a second fin-type active area protruding from a second region of the substrate and comprising a second channel region of a second conductivity type;
    a second device isolation layer covering lower side walls of the second fin-type active area on the second region; and
    a second gate insulating layer on the second region, the second gate insulating layer extending to cover the second channel region and the second device isolation layer,
    wherein the first gate insulating layer on the first device isolation layer has a structure that is closer to the substrate as a distance from the first fin-type active area increases.

5. The integrated circuit device of claim 4, wherein the first gate insulating layer has a first thickness on the first fin-type active area and the second gate insulating layer has a second thickness on the second fin-type active area, wherein the second thickness is smaller than the first thickness; and
    wherein the second gate insulating layer on the second device isolation layer has a structure that is closer to the substrate as a distance from the second fin-type active area increases.

6. The integrated circuit device of claim 4:
    wherein the plurality of liners comprise a first insulating liner and a first stress liner including materials different from each other on the first region;

wherein the first insulating liner contacts the lower side walls of the first fin-type active area and has a first top surface at a first height from the substrate; and wherein the first stress liner is spaced apart from the lower side walls of the first fin-type active area and has a second top surface at a second height from the substrate, wherein the first gate insulating layer is between the first stress liner and the lower side walls of the first fin-type active area, and the second height is higher than the first height.

7. The integrated circuit device of claim 4, wherein a gate line on the first device isolation layer has a structure that is closer to the substrate as a distance from the first fin-type active area increases.

8. The integrated circuit device of claim 4, wherein the first device isolation layer comprises a first upper surface having a first inclined edge portion and a first concave center portion, wherein the first inclined edge portion has a highest point contacting the plurality of liners, the highest point of the first inclined edge portion being lower than a top surface of the plurality of liners.

9. The integrated circuit device of claim 4, wherein the second device isolation layer comprises a second upper surface having a second inclined edge portion and a second concave center portion, wherein the second inclined edge portion has a height which decreases toward the second concave center portion.

10. The integrated circuit device of claim 4, further comprising:
a first gate line covering the first gate insulating layer, the first channel region, and the first device isolation layer, wherein the first gate line has recessed surface portions contacting the first protrusions and has a structure that is closer to the substrate as a distance from the first fin-type active area increases; and
a second gate line covering the second gate insulating layer, the second channel region, and the second device isolation layer, wherein the second gate line has a structure that is closer to the substrate as a distance from the second fin-type active area increases.

11. The integrated circuit device of claim 4, wherein the first channel region of the first fin-type active area has a first width, and the second channel region of the second fin-type active area has a second width, wherein the second width is smaller than the first width.

12. The integrated circuit device of claim 6, wherein the first device isolation layer has a first sidewall contacting the first stress liner, wherein the first sidewall has a first highest point at a third height from the substrate, and the third height is lower than the second height.

13. The integrated circuit device of claim 6, further comprising:
a second insulating liner covering lower side walls of the second fin-type active area, wherein the second gate insulating layer is between the second fin-type active area and the second device isolation layer on the second region, wherein the second insulating liner and the second device isolation layer contact each other.

14. The integrated circuit device of claim 6, further comprising:
a second insulating liner covering lower side walls of the second fin-type active area, wherein the second gate insulating layer is between the second fin-type active area and the second device isolation layer on the second region; and a second stress liner between the second insulating liner and the second device isolation layer on the second region,
wherein the second insulating liner has a fourth top surface at a fourth height from the substrate, the second stress liner has a fifth top surface at a fifth height from the substrate, wherein the fifth height is higher than the fourth height, and a height difference between the fifth top surface and the fourth top surface is smaller than a height difference between the second top surface and the first top surface.

15. The integrated circuit device of claim 14, wherein the second device isolation layer has a second sidewall contacting the second stress liner, wherein the second sidewall has a second highest point at a sixth height from the substrate, and the sixth height is lower than the fifth height.

16. The integrated circuit device of claim 14, wherein the second gate insulating layer comprises second protrusions located on portions of the second gate insulating layer which cover the second stress liner, wherein the second protrusions are smaller than the first protrusions.

17. An integrated circuit device comprising:
a fin-type active area protruding from a substrate;
a first liner covering a first lower side wall of the fin-type active area;
a first device isolation layer covering the first lower side wall of the fin-type active area, wherein the first liner is between the first device isolation layer and the first lower side wall of the fin-type active area;
a second liner covering a second lower side wall of the fin-type active area, wherein the second lower side wall is opposite to the first lower side wall and has a different structure from the first liner;
a second device isolation layer covering the second lower side wall of the fin-type active area, wherein the second liner is between the second device isolation layer and the second lower side wall of the fin-type active area; and
a first gate insulating layer extending to cover the fin-type active area, the first liner, and the first device isolation layer, and comprising first protrusions located on portions of the first gate insulating layer which cover the first liner, and
wherein opposite sidewalls of the fin-type active area have asymmetric profiles based on a center line extending along a height direction of the fin-type active area.

18. The integrated circuit device of claim 17, wherein the substrate comprises a first conductivity type transistor region and a second conductivity type transistor region that are adjacent to each other, and
wherein the fin-type active area extends along a boundary between the first conductivity type transistor region and the second conductivity type transistor region.

19. The integrated circuit device of claim 17, further comprising:
a second gate insulating layer extending to cover the fin-type active area, the second liner, and the second device isolation layer,
wherein the second gate insulating layer is integrally connected to the first gate insulating layer, and the second gate insulating layer comprises second protrusions located on portions of the second gate insulating layer which cover the second liner, wherein the second protrusions are smaller than the first protrusions.

* * * * *